United States Patent
Ahammed et al.

(10) Patent No.: US 12,348,227 B2
(45) Date of Patent: Jul. 1, 2025

(54) DOUBLE DATA RATE OUTPUT CIRCUIT WITH RECONFIGURABLE EQUALIZER

(71) Applicant: QUALCOMM Incorporated, San Diego, CA (US)

(72) Inventors: Jaseem Ahammed, San Marcos, CA (US); Ashwin Sethuram, San Clemente, CA (US)

(73) Assignee: QUALCOMM INCORPORATED, San Diego, CA (US)

( * ) Notice: Subject to any disclaimer, the term of this patent is extended or adjusted under 35 U.S.C. 154(b) by 211 days.

(21) Appl. No.: 18/358,807

(22) Filed: Jul. 25, 2023

(65) Prior Publication Data

US 2025/0038738 A1    Jan. 30, 2025

(51) Int. Cl.
| | |
|---|---|
| *H03K 19/0185* | (2006.01) |
| *H03K 3/356* | (2006.01) |
| *H03K 5/134* | (2014.01) |
| *H03K 19/003* | (2006.01) |

(52) U.S. Cl.
CPC ....... *H03K 3/356113* (2013.01); *H03K 5/134* (2014.07); *H03K 19/00361* (2013.01); *H03K 19/018521* (2013.01)

(58) Field of Classification Search
CPC ....... H03K 19/0175; H03K 19/017509; H03K 19/017545; H03K 19/017581; H03K 19/01759; H03K 19/0185; H03K 19/018507; H03K 19/018557; H03K 19/00346; H03K 19/00361; H03K 19/01; H03K 19/017; H03K 19/01728; H03K 19/01742; H03K 19/018592; G11C 11/4093; G11C 7/1054; G11C 7/1057
See application file for complete search history.

(56) References Cited

U.S. PATENT DOCUMENTS

| | | | |
|---|---|---|---|
| 10,063,232 B1 * | 8/2018 | Tan ................... | H03K 19/0185 |
| 11,388,032 B1 * | 7/2022 | Arai .................. | H04L 25/03343 |
| 2011/0316726 A1 * | 12/2011 | Hollis ................ | H04L 25/4927 341/56 |
| 2014/0368272 A1 * | 12/2014 | Wang ............. | H03K 19/018514 330/260 |
| 2024/0202151 A1 * | 6/2024 | Lee .................... | H03K 19/0005 |
| 2025/0038738 A1 * | 1/2025 | Ahammed ............ | H03K 5/134 |

* cited by examiner

*Primary Examiner* — Jason M Crawford
(74) *Attorney, Agent, or Firm* — Loza & Loza, LLP

(57) ABSTRACT

A reconfigurable driver in an I/O circuit has a first transistor provided in a first pullup structure, a second transistor provided in a second pullup structure, and a control circuit that generates a control signal provided to a gate of the second transistor. A gate of the first transistor receives a data signal. The control signal is an inverted, delayed version of the data signal in a first mode. The control signal turns off the second transistor in a second mode. The control circuit generates the control signal using a version of the data signal when operated in a third mode. The second pullup structure may be used to provide one-shot equalization to an output of the reconfigurable driver when the second pullup structure is operated in the first mode. The second transistor may be a thin-oxide PMOS transistor. The first transistor may be a thin-oxide NMOS transistor.

30 Claims, 10 Drawing Sheets

DOUBLE DATA RATE OUTPUT CIRCUIT WITH RECONFIGURABLE EQUALIZER

TECHNICAL FIELD

The present disclosure generally relates to driver circuits in a memory interface and more particularly to a driver circuit that includes a configurable equalizer.

BACKGROUND

Electronic device technologies have seen explosive growth over the past several years. For example, growth of cellular and wireless communication technologies has been fueled by better communications, hardware, larger networks, and more reliable protocols. Wireless service providers are now able to offer their customers an ever-expanding array of features and services, and provide users with unprecedented levels of access to information, resources, and communications. To keep pace with these service enhancements, mobile electronic devices (e.g., cellular phones, tablets, laptops, etc.) have become more powerful and complex than ever. Wireless devices may include a high-speed bus interface for communication of signals between hardware components. For example, the high-speed bus interface may be implemented using a Peripheral Component Interconnect Express (PCIe) bus, Universal Serial Bus (USB) or Serial Advanced Technology Attachment (SATA), among others.

In certain implementations, a high-speed serial bus interface may be configurable for different modes of communication. For example, integrated circuit (IC) devices that include memory interfaces have physical layer circuits may be expected to operate in one or more high-speed data communication modes and one or more low-speed data communication modes. Different signaling voltages may be defined for high-speed and low-speed data communication modes. Increased demands for higher data rates require increasingly tight timing between circuits within the memory interface in order to ensure integrity of the data and clock signals between memory controller and memory devices. Performance, accuracy and/or reliability of data communication interfaces may depend on the flexibility and reliability of driver circuits that are expected to accommodate changes in transmission speed, supply voltage variances and other factors that can impact the operation of high-speed data links. Therefore, there is an ongoing need for improvements that provide reliable transmission of clock, data and control signals over high-speed data links.

SUMMARY

Certain aspects of the disclosure relate to systems, apparatus, methods and circuits that can be used in high-speed interfaces to provide pre-equalization or enhanced line driving capability in certain modes of operation.

In various aspects of the disclosure, a reconfigurable driver in an input/output (I/O) circuit includes a first transistor provided in a first pullup structure, the first transistor having a gate configured to receive a data signal that is propagated from an input of the driver, a second transistor provided in a second pullup structure, the second transistor having a gate coupled to a control signal, and a control circuit that generates the control signal and that has an input configured to receive the data signal, the control circuit being configured to generate the control signal using an inverted, delayed version of the data signal when the second pullup structure is operated in a first mode, and maintain the control signal in a signaling state that turns off the second transistor when the second pullup structure is operated in a second mode.

In various aspects of the disclosure, an apparatus includes means for propagating a data signal from an input of a driver in an input/output circuit to a gate of a first transistor in a first pullup structure of the driver, and means for generating a control signal that is provided to a gate of a second transistor in a second pullup structure of the driver. The means for generating the control signal may be configured to generate the control signal by inverting and delaying the data signal when the second pullup structure is operated in a first mode. The control signal can be configured to turn off the second transistor when the second pullup structure is operated in a second mode.

In various aspects of the disclosure, a method for reconfiguring a driver in an I/O circuit includes causing a data signal to be propagated from an input of the driver to a gate of a first transistor in a first pullup structure of the driver, providing a control signal to a gate of a second transistor in a second pullup structure of the driver, generating the control signal by inverting and delaying the data signal when the second pullup structure is operated in a first mode, and configuring the control signal to turn off the second transistor when the second pullup structure is operated in a second mode.

In one aspect, the second pullup structure provides one-shot equalization to an output of the reconfigurable driver when the second pullup structure is operated in the first mode.

In certain aspects, the control circuit is further configured to generate the control signal by propagating a version of the data signal to the gate of the second transistor when the second pullup structure is operated in a third mode. The data signal may have a higher frequency when the second pullup structure is operated in the first mode than when the second pullup structure is operated in the third mode. The data signal may have a frequency of at least 4.8 gigahertz when the second pullup structure is operated in the first mode. The second transistor may be implemented using a thin-oxide P-type metal-oxide-semiconductor (PMOS) transistor. The first transistor may be a thin-oxide N-type metal-oxide-semiconductor (NMOS) transistor.

In certain aspects, the control signal can be configured to cause the first transistor to pull an output of the reconfigurable driver toward a high voltage level while the data signal is at a first signaling state. The control signal may be configured to cause the second transistor to pull the output of the reconfigurable driver toward the high voltage level commencing at a transition of the data signal from a second signaling state to the first signaling state. The control signal may be configured to turn off the second transistor before the data signal returns to the second signaling state.

In certain aspects, the second transistor is turned off after a delay following a transition of the data signal from a first signaling state to a second signaling state when the second pullup structure is operated in the first mode. The delay may be determined by timing of the control signal generated by the control circuit when the second pullup structure is operated in the first mode.

In certain aspects, the first pullup structure and the second pullup structure are provided in one of a plurality of reconfigurable drivers coupled to an output terminal of a transmitting device in a low-power double data rate synchronous dynamic random access memory.

DETAILED DESCRIPTION

Figure 1:
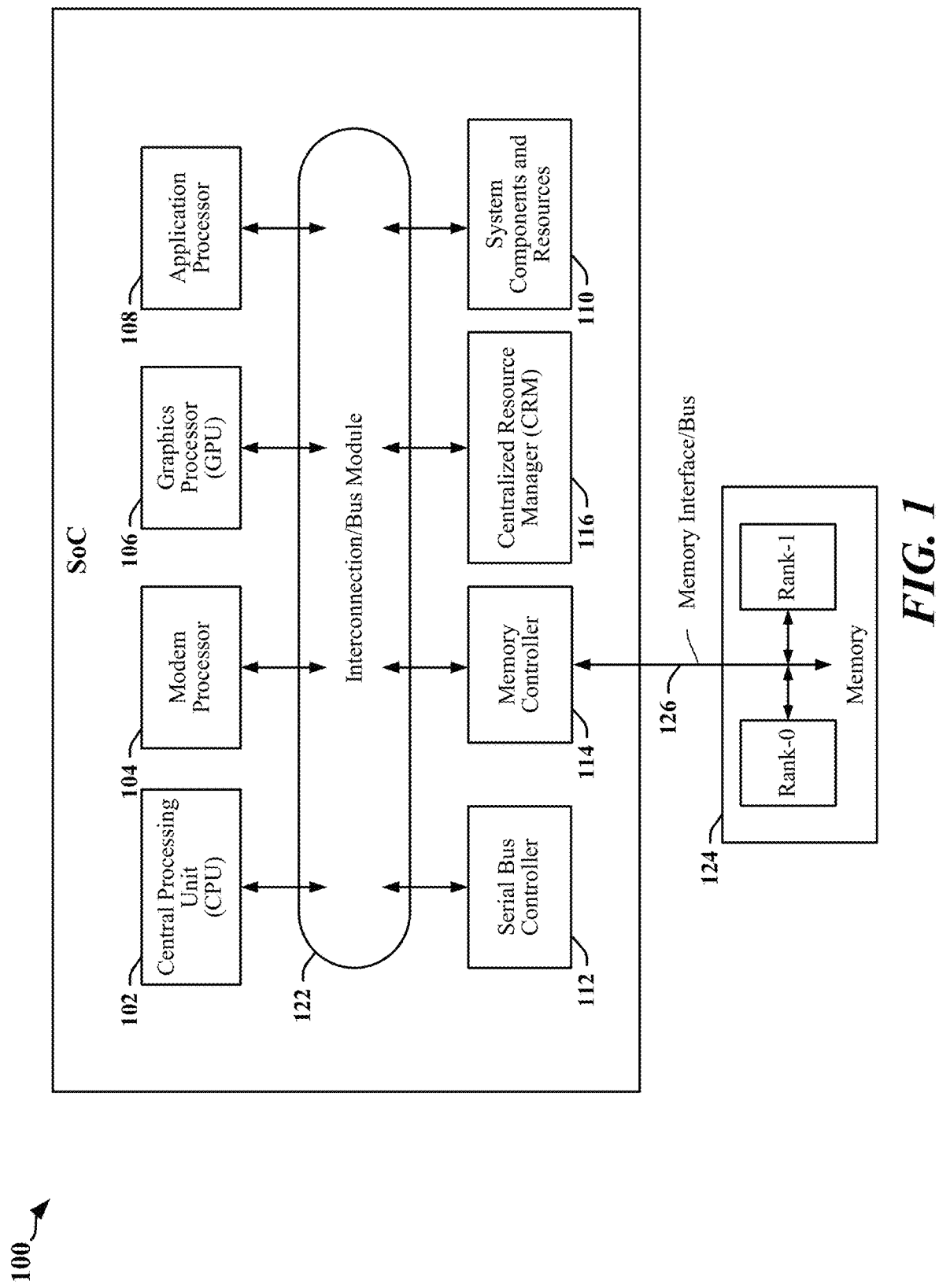
FIG. 1 illustrates an example of a system-on-a-chip (SOC) that may be adapted in accordance with certain aspects of the present disclosure.

The detailed description set forth below in connection with the appended drawings is intended as a description of various configurations and is not intended to represent the only configurations in which the concepts described herein may be practiced. The detailed description includes specific details for the purpose of providing a thorough understanding of various concepts. However, it will be apparent to those skilled in the art that these concepts may be practiced without these specific details. In some instances, well-known structures and components are shown in block diagram form in order to avoid obscuring such concepts.

With reference now to the Figures, several exemplary aspects of the present disclosure are described. The word "exemplary" is used herein to mean "serving as an example, instance, or illustration." Any aspect described herein as "exemplary" is not necessarily to be construed as preferred or advantageous over other aspects.

The terms "computing device" and "mobile device" are used interchangeably herein to refer to any one or all of servers, personal computers, smartphones, cellular telephones, tablet computers, laptop computers, notebooks, ultrabooks, palm-top computers, personal data assistants (PDAs), wireless electronic mail receivers, multimedia Internet-enabled cellular telephones, Global Positioning System (GPS) receivers, wireless gaming controllers, and similar personal electronic devices which include a programmable processor. While the various aspects are particularly useful in mobile devices (e.g., smartphones, laptop computers, etc.), which have limited resources (e.g., processing power, battery, size, etc.), the aspects are generally useful in any computing device that may benefit from improved processor performance and reduced energy consumption.

The term "multicore processor" is used herein to refer to a single integrated circuit (IC) chip or chip package that contains two or more independent processing units or cores (e.g., CPU cores, etc.) configured to read and execute program instructions. The term "multiprocessor" is used herein to refer to a system or device that includes two or more processing units configured to read and execute program instructions.

The term "system on chip" (SoC) is used herein to refer to a single integrated circuit (IC) chip that contains multiple resources and/or processors integrated on a single substrate. A single SoC may contain circuitry for digital, analog, mixed-signal, and radio-frequency functions. A single SoC may also include any number of general purpose and/or specialized processors (digital signal processors (DSPs), modem processors, video processors, etc.), memory blocks (e.g., read only memory (ROM), random access memory (RAM), flash, etc.), and resources (e.g., timers, voltage regulators, oscillators, etc.), any or all of which may be included in one or more cores.

Process technology employed to manufacture semiconductor devices, including IC devices is continually improving. Process technology includes the manufacturing methods used to make IC devices and defines transistor size, operating voltages and switching speeds. Features that are constituent elements of circuits in an IC device may be referred as technology nodes and/or process nodes. The terms technology node, process node, process technology may be used to characterize a specific semiconductor manufacturing process and corresponding design rules. Faster and more power-efficient technology nodes are being continuously developed through the use of smaller feature size to produce smaller transistors that enable the manufacture of higher-density ICs.

ICs typically provide multiple voltage domains for power saving purposes. For example, higher voltage domains provide power at higher voltage levels than lower voltage domains. Higher voltage domains are sometimes needed for interfacing with external devices, while core logic circuits can generally operate at the lower voltage levels available in lower voltage domains. For the purposes of this disclosure, a thick-oxide transistor may refer to a transistor that has a gate oxide thickness sufficient to enable the transistor to withstand and operate at the higher voltage levels in higher voltage domains and a thin-oxide transistor may refer to a transistor that has a gate oxide thickness that is insufficient to avoid electrical overstress when the transistor spans a higher voltage level in the higher voltage domains. In certain examples disclosed herein, a thin-oxide transistor may be rated for voltages up to 0.6 volts and a thick-oxide transistor may be rated for voltages greater than 0.6 volts and thick-oxide transistors may be used in a higher a high-voltage domain that provides power at 1.2 volts.

Advancements in process technologies tend to reduce transistor gate length and other feature sizes with IC devices. Reductions in gate length and feature sizes can increase the susceptibility of IC devices to electrostatic discharge (ESD) events. IC devices often include ESD protection circuits that can protect interface circuits during different types of ESD events. IC devices may be tested to ensure that they meet minimum industry standards regarding ESD protection. IC device qualification processes may include testing the susceptibility of the IC device to ESD events based on a human-body model (HBM) or based on a charged-device model (CDM) characterization of ESD events. Some ESD protection circuits are based on or evaluated using an HBM or a CDM. The HBM is intended to characterize the susceptibility of devices to damage from ESD events of ±1 k Volt resulting from human touching of an electronic device. The CDM is intended to characterize the susceptibility of devices to damage from ESD events of ±250 Volts that relate to sudden discharges of energy accumulated in an IC chip or package through direct contact charging or field-induced charging.

FIG. 1 illustrates examples of components and interconnections in a system-on-chip (SoC) 100, including a memory interface/bus 126, that may be suitable for implementing certain aspects of the present disclosure. The SoC 100 may include a number of heterogeneous processors, such as a central processing unit (CPU) 102, a modem processor 104, a graphics processor 106, and an application processor 108. Each processor 102, 104, 106, 108, may include one or more cores, and each processor/core may perform operations independent of the other processors/cores. The processors 102, 104, 106, 108 may be organized in close proximity to one another (e.g., on a single substrate, die, integrated chip, etc.) so that the processors may operate at a much higher frequency/clock rate than would be possible if the signals were to travel off-chip. The proximity of the cores may also allow for the sharing of on-chip memory and resources (e.g., voltage rails), as well as for more coordinated cooperation between cores.

The SoC 100 may include system components and resources 110 for managing sensor data, analog-to-digital conversions, and/or wireless data transmissions, and for performing other specialized operations (e.g., decoding high-definition video, video processing, etc.). System components and resources 110 may also include components such as voltage regulators, oscillators, phase-locked loops (PLLs), peripheral bridges, data controllers, system controllers, access ports, timers, and/or other similar components used to support the processors and software clients running on the computing device. The system components and resources 110 may also include circuitry for interfacing with peripheral devices, such as cameras, electronic displays, wireless communication devices, external memory chips, etc.

The SoC 100 may further include a Universal Serial Bus (USB) or other serial bus controller 112, one or more memory controllers 114, and a centralized resource manager (CRM) 116. The SoC 100 may also include an input/output module (not illustrated) for communicating with resources external to the SoC, each of which may be shared by two or more of the internal SoC components.

The processors 102, 104, 106, 108 may be interconnected to the USB controller 112, the memory controller 114, system components and resources 110, CRM 116, and/or other system components via an interconnection/bus module 122, which may include an array of reconfigurable logic gates and/or implement a bus architecture. Communications may also be provided by advanced interconnects, such as high-performance networks on chip.

The interconnection/bus module 122 may include or provide a bus mastering system configured to grant SoC components (e.g., processors, peripherals, etc.) exclusive control of the bus (e.g., to transfer data in burst mode, block transfer mode, etc.) for a set duration, number of operations, number of bytes, etc. In some cases, the interconnection/bus module 122 may implement an arbitration scheme to prevent multiple master components from attempting to drive the bus simultaneously.

The memory controller 114 may be a specialized hardware module configured to manage the flow of data to and from a memory 124 via the memory interface/bus 126. In some examples, the memory controller 114 includes one or more processors configured to perform read and write operations with the memory 124. Examples of processors include microprocessors, microcontrollers, digital signal processors (DSPs), field programmable gate arrays (FPGAs), programmable logic devices (PLDs), state machines, gated logic, discrete hardware circuits, and other suitable hardware configured to perform the various functionality described throughout this disclosure. Certain aspects disclosed herein may relate to a memory 124 that is included in an SoC 100.

Memory technologies described herein may be suitable for storing instructions, programs, control signals, and/or data for use in or by a computer or other digital electronic device. Any references to terminology and/or technical details related to an individual type of memory, interface, standard, or memory technology are for illustrative purposes only, and not intended to limit the scope of the claims to a particular memory system or technology unless specifically recited in the claim language. Mobile computing device architectures have grown in complexity, and now commonly include multiple processor cores, SoCs, co-processors, functional modules including dedicated processors (e.g., communication modem chips, GPS receivers, etc.), complex memory systems, intricate electrical interconnections (e.g., buses and/or fabrics), and numerous other resources that execute complex and power intensive software applications (e.g., video streaming applications, etc.).

Certain aspects of the disclosure are applicable to input/out (I/O) circuits that provide an interface between core circuits and memory devices. The memory 124 may include or incorporate Synchronous Dynamic Random Access Memory (SDRAM), including Low-Power double data rate SDRAM, which may be referred to as low-power DDR SDRAM, LPDDR SDRAM or, in some instances, LPDDRi SDRAM where i describes the technology generation of the LPDDR SDRAM. In one example, the memory 124 may be operated in LPDDR2 SDRAM and LPDDR4X SDRAM modes of operation, which may be referred to herein as the "LP2" and "LP4X" modes, respectively.

In some implementations, the memory 124 may include double data rate input/output (DDRIO) circuits that enable the memory 124 to communicate with corresponding DDRIO circuits in the SoC 100 or another device coupled to the memory 124. DDRIO may be configurable for multimode operation. In some instances, a transmitter in the DDRIO of a memory 124 may include multiple circuits that perform the same function at different voltage levels when the memory 124 supports LP2 and LP4X modes of operation. Later generations of LPDDR SDRAM designed to operate at higher operating frequencies may employ lower voltage levels in the core of an SoC or memory device to mitigate for increased power associated with the higher operating frequencies.

Bandwidth available for signaling between a memory controller 114 and a memory 124 may be limited due to the effects of channel loss and other attenuations as well distortions in waveforms caused by unmatched terminations, interference and limitations of DDRIO circuits. Signal quality may vary according to operating conditions that may be characterized as all process, voltage, and temperature (PVT) corners. Certain aspects of this disclosure relate to DDRIO equalization techniques that can offset channel losses and other distortions to enable reliable high-speed operation in systems that employ LPDDR SDRAM. In one example, pre-emphasis equalization may be used by a driver in a DDRIO circuit to overdrive signals at transitions between signaling states, thereby providing an increased data sampling time at the receiver.

Figure 2:
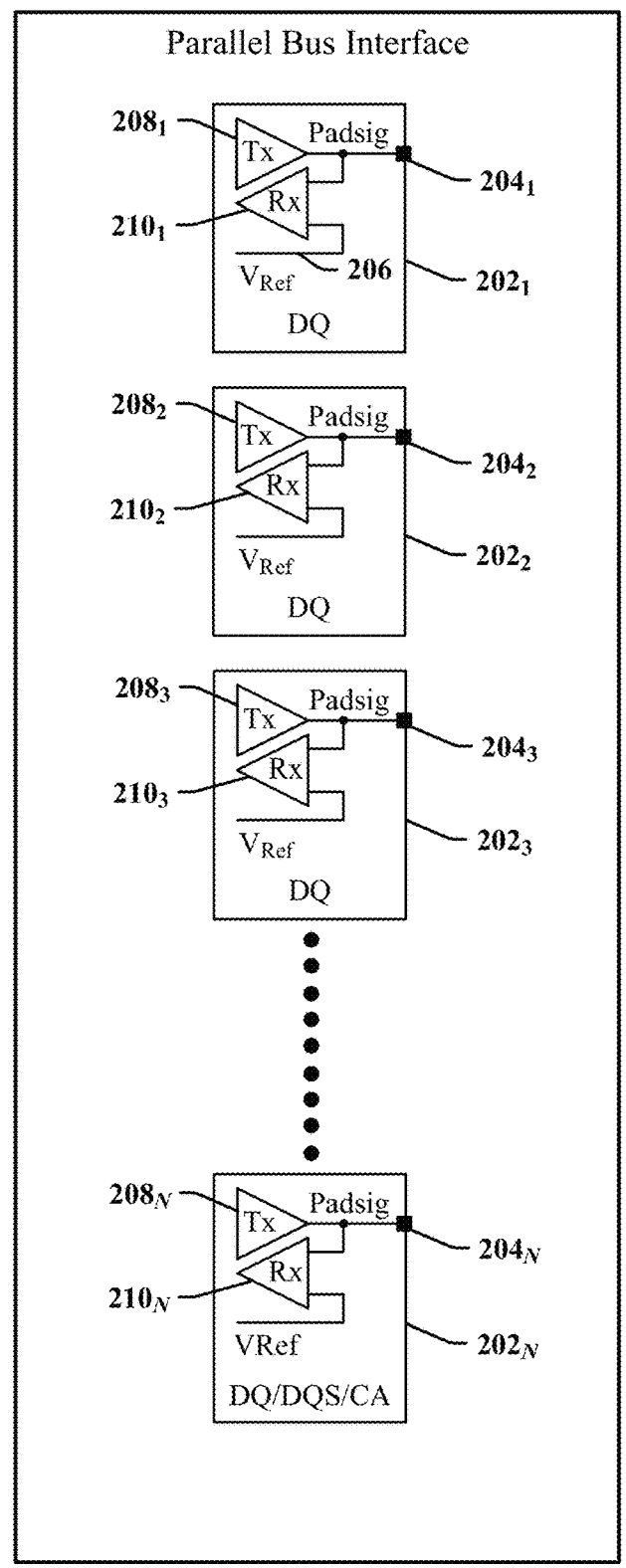
FIG. 2 illustrates certain aspects of a parallel bus interface that may be provided in a memory controller configured in accordance with certain aspects of the present disclosure.

FIG. 2 illustrates certain aspects of a parallel bus interface 200 that may be provided in a memory controller coupled to high-speed LPDDR memory, for example. In some implementations, line drivers in the parallel bus interface 200 are expected to drive a two-rank LPDDR load. As used herein, two or more memory ranks coupled in parallel to a memory controller are accessed simultaneously by asserting a single chip select signal. The parallel bus interface 200 provides DDRIO circuits $202_1$-$202_N$ that are coupled to corresponding terminals of each memory rank. In one example, a terminal may refer to a pad in an IC device to which a connecting wire may be bonded or otherwise contacted. Each of the DDRIO circuits $202_1$-$202_N$ may be configured to transmit and/or receive a data signal (DQ), a differential strobe signal (DQS) or a Command/Address signal (CA). In some implementations, a single memory rank is coupled to the DDRIO circuits $202_1$-$202_N$. Each DDRIO circuits $202_1$-$202_N$ includes a driver $208_1$-$208_N$ and a receiver $210_1$-$210_N$. The output of each driver $208_1$-$208_N$ and each receiver $210_1$-$210_N$ is coupled to an input/output (I/O) terminal $204_1$-$204_N$ of the parallel bus interface 200. The receivers $210_1$-$210_N$ may compare signaling state of a corresponding I/O terminal $204_1$-$204_N$ to a reference voltage level (e.g., $V_{Ref}$ 206) in order to decode data from the parallel bus that couples the parallel bus interface 200 to memory.

Figure 3:
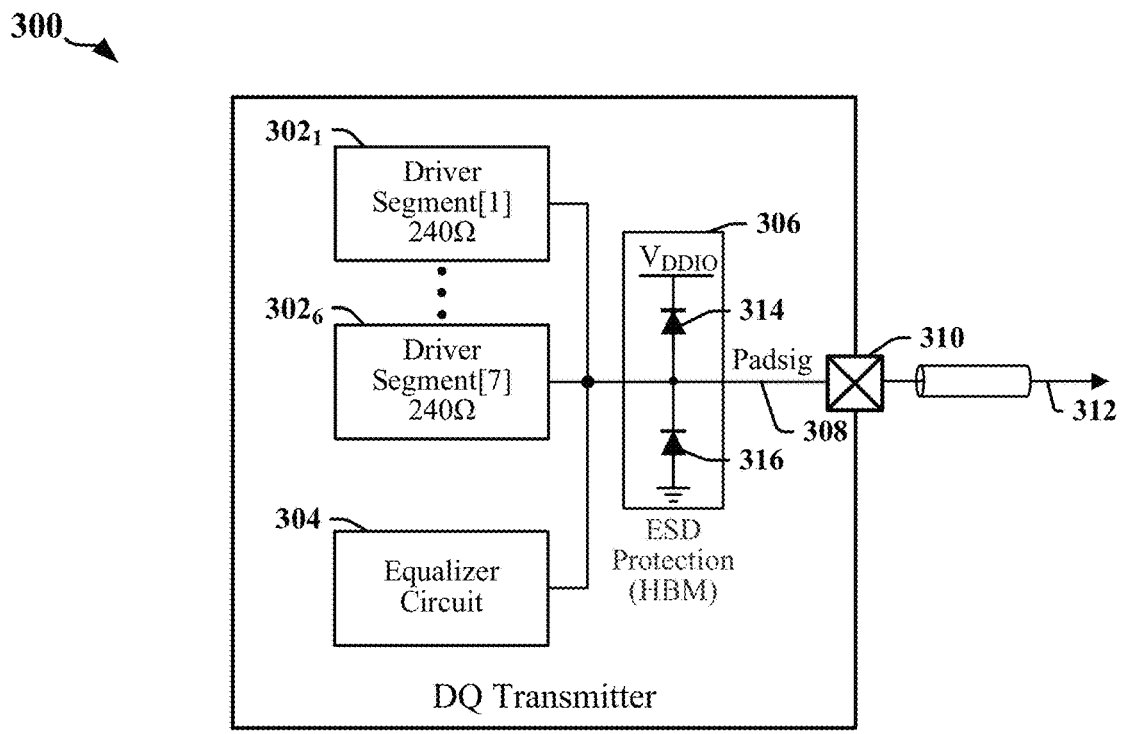
FIG. 3 illustrates certain features of an input/output circuit in a high-speed memory interface.
Figure 3:
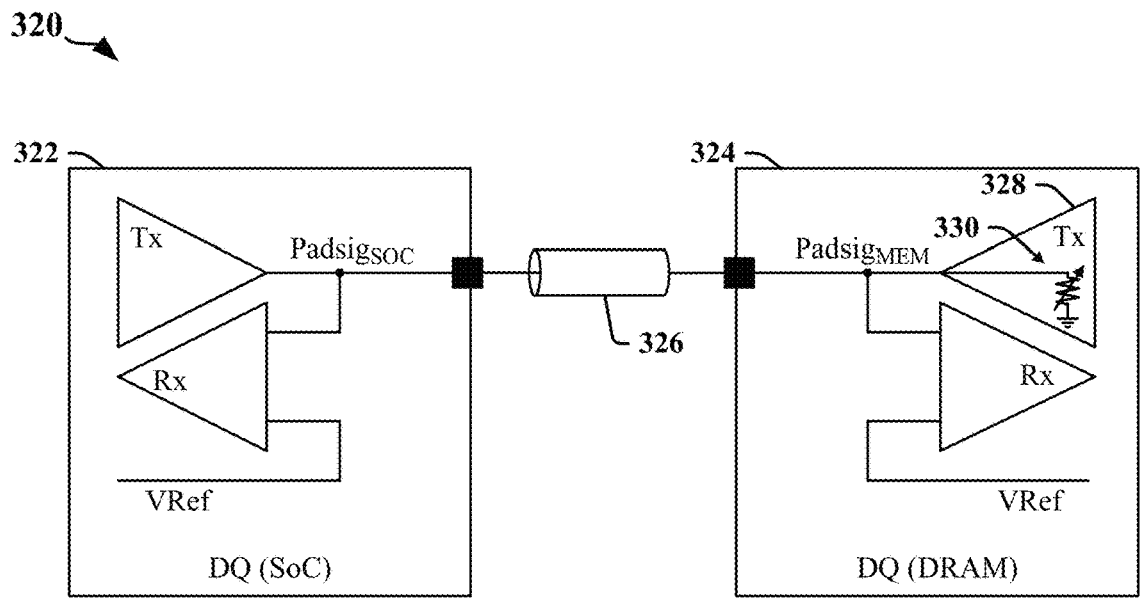

Certain features of a DDRIO circuit 300 are illustrated in FIG. 3. The DDRIO circuit 300 may correspond to one of the DDRIO circuits $202_1$-$202_N$ illustrated in FIG. 2 and may be coupled to an I/O terminal 310 that represents one of the I/O terminals $204_1$-$204_N$ illustrated in FIG. 2. In particular, the illustrated DDRIO circuit 300 corresponds to the configuration of one of the drivers $208_1$-$208_N$ illustrated in FIG. 2. The I/O terminal 310 may be coupled to a line 312 of a high-speed parallel bus that interconnects a memory controller and one or more memory devices. An ESD protection circuit 306, which may be HBM-qualified, may be coupled to the I/O terminal 310. The illustrated ESD protection circuit 306 includes a two diodes 314, 316 that are reverse biased unless a current surge causes a voltage at the I/O terminal 310 to exceed the nominal or rated voltage of the power supply provided to the DDRIO circuit 300. For the purposes of this description, the I/O terminal 310 may correspond to a pad in an IC device or SoC that facilitates bonding or contacting with a connecting wire or other interconnect.

The DDRIO circuit 300 includes multiple driver segments $302_1$-$302_6$ and an equalizer circuit 304. The number of driver segments $302_1$-$302_6$ provided in the DDRIO circuit 300 may be determined by the characteristics of the line 312 that is to be driven and the nature and value of termination at the transmitting and/or or receiving devices. In the example of LPDDR SDRAM, the line 312 may be unterminated when low-power, lower-frequencies are transmitted. Lower frequency signals may be transmitted at higher voltage levels than higher frequency signals. Higher frequency signaling in LPDDR SDRAM applications may use signaling transmitted at near-ground voltage levels and line terminations may be provided.

The number of driver segments $302_1$-$302_6$ used to drive the line 312 may be calculated to provide a desired current or voltage level on the line 312. The number and nature of the driver segments $302_1$-$302_6$ used to drive the line 312 may be selected to meet a specified or desired transition time of a signal (Padsig 308) to be transmitted over the line 312 through the I/O terminal 310. Certain LPDDR specifications require that DDRIO circuits support aggressive scaling of the voltage of ($V_{DDA}$) core power rails in order to support higher power optimization. The number and type of driver segments $302_1$-$302_6$ used to drive the line 312 may be dynamically selected based on mode of operation.

The multiple driver segments $302_1$-$302_6$ in the DDRIO circuit 300 may be configured to support different drive strengths and on-die DQ termination (ODT) requirements. In the illustrated example, each driver segment $302_1$-$302_6$ is calibrated to provide a pull-down impedance of 240 ohms. Pull-up may be calibrated to a nominal high output voltage ($V_{OH}$) target, which may be specified with reference to the output power rail voltage ($VDD_{IO}$). $V_{OH}$ represents the minimum required voltage swing for a defined mode of operation. In the example of LPDDR6 memory, $V_{OH}$=0.5*$VDD_{IO}$ for terminated lines and $V_{OH}$=$VDD_{IO}$ for unterminated lines.

The bandwidth of the DDRIO circuit 300 is limited by certain alternating current (AC) characteristics of the active driver segments $302_1$-$302_6$, the equalizer circuit 304, the ESD protection circuit 306 and the line 312 coupled to the I/O terminal 310, which can contribute to the I/O capacitance ($C_{IO}$) measured at the I/O terminal 310. $C_{IO}$ is typically a critical parameter and can limit AC performance at higher frequencies. The equalizer circuit 304 may be configured to offset certain effects of $C_{IO}$ and other parameters that may introduce distortion and non-linear response of the DDRIO circuit 300 and line 312. In some examples, the equalizer circuit 304 may be configured to provide or approximate pre-emphasis in order to mitigate for channel loss and linear inter-symbol interference (ISI). ISI can distort signals when a pulse or an edge transmitted in a time interval (i.e., a unit interval or UI) is affected by a pulse or an edge transmitted in a preceding UI due to non-linear frequency response of the line 312, for example. The equalizer circuit 304 may be provided to enable the DDRIO circuit 300 to operate at, or switch between standards-defined frequencies for LPDDR SDRAM of 6.4 GHz and 4.8 GHz, for example.

FIG. 3 also illustrates an interface 320 that includes a DDRIO circuit 322 in an SoC and a DDRIO circuit 324 in a memory device, where a line 326 of a parallel bus (also referred to as a channel) couples the two DDRIO circuits 322, 324. In the illustrated interface, a termination resistance 330 is provided in the driver 328 of the DDRIO circuit 324 provided in the memory device. The resistance 330 may be implemented as a variable resistor for which resistance can be configured to accommodate changes between low-speed, high-voltage and high-speed, low-voltage modes of operation.

Figure 4:
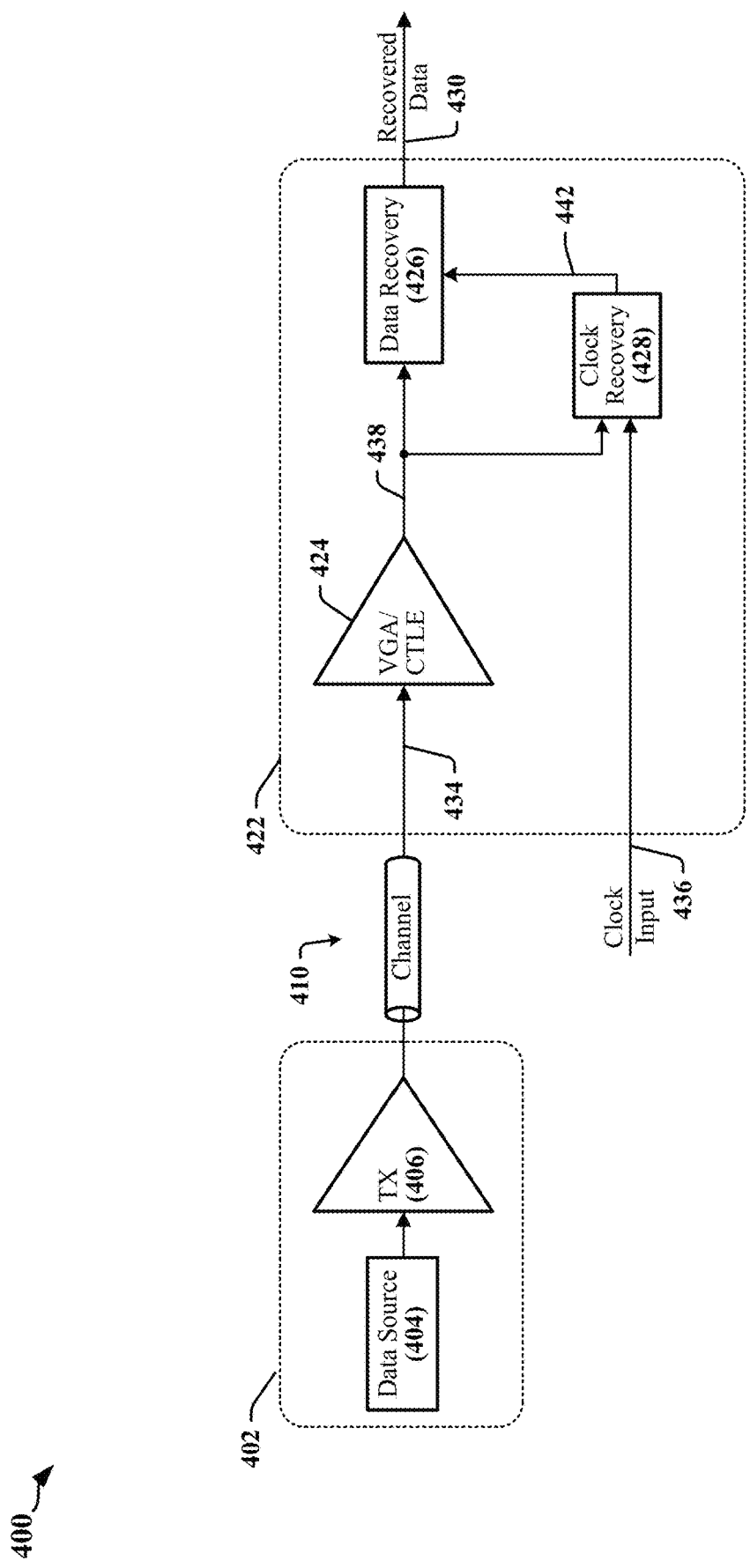
FIG. 4 illustrates an example of a transmission path in a data communication system that may be adapted in accordance with certain aspects of the present disclosure.

FIG. 4 illustrates an example of a transmission path in a data communication system 400 that may be adapted in accordance with certain aspects of this disclosure. The data communication system 400 includes a transmitter 402, a data communication channel 410, and a receiver 422. The transmitter 402 may be provided in a first device that is configured to transmit a data signal to a second device. The data communication channel 410 provides a transmission medium through which a transmitted data signal propagates from the first device to the second device. The receiver 422 is provided in the second device and may be configured to receive and process a received data signal 434.

In one example, the transmitter 402 includes a data source 404 configured to provide a stream of data for transmission through the data communication channel 410. The transmitter 402 further includes a transmit driver (TX 406) configured to generate the transmitted data signal for transmission to the receiver 422 over the data communication channel 410. The data communication channel 410 may be implemented using any type of transmission medium by which a data signal can propagate from the transmitter 402 to the receiver 422. In certain examples, the data communication channel 410 includes one or more metallization traces (which may include one or more vias) on a printed circuit board (PCB), stripline, microstrip, coaxial cable, twisted pair, etc.

For the purposes of this disclosure, the illustrated receiver 422 includes an amplifier 424, which may be implemented in a single stage or multiple stages, a clock recovery circuit 428, and a data recovery circuit 426. In some instances, the amplifier 424 may be configured to perform equalization and amplification of the received data signal 434. For example, the amplifier 424 may be implemented as a variable gain amplifier (VGA) and may be coupled to or include a continuous time linear equalizer (CTLE). A CTLE may implement techniques for boosting the higher frequency components of the signal at the receiver in order to bring all frequency components of the signal to a similar amplitude. A clock recovery circuit 428 may be configured to receive a clock input 436 and/or to recover clock information associated with the data signal 434. In one example, the clock input 436 is a version of a clock signal received from the transmitter 402. The clock recovery circuit 428 may generate a data recovery clock signal 442 that can be used by the data recovery circuit 426 to sample or otherwise capture the serial data from the amplified data signal 438 and output recovered data 430. The clock recovery circuit 428 may be configured to provide edges (transitions) in the data recovery clock signal 442, where the edges are timed to fall within the window of stability during which data can be reliably sampled. The data recovery clock signal 442 may be provided in two or more phase versions that can be used directly by the data recovery circuit 426.

The data signal 434 or the clock signal received from the transmitter 402 may be distorted during transmission through the data communication channel 410. Distortion may arise for various reasons including impedance mismatches in the data communication channel 410, interference and reflected energy. Signal distortion can make it difficult to recover the clock information and the data by the clock recovery circuit 428 and can limit the window of stability during which data can be reliably sampled from the amplified data signal 438. In some examples, distortion in the received data signal 434 caused by high frequency attenuation can be addressed by the amplifier 424, which may be configured to perform equalization and amplification that increases the high frequency components of the received data signal 434 in order to increase the data rate at which the data may be sent through the data communication channel 410 and reliably recovered at the receiver 422.

Figure 5:
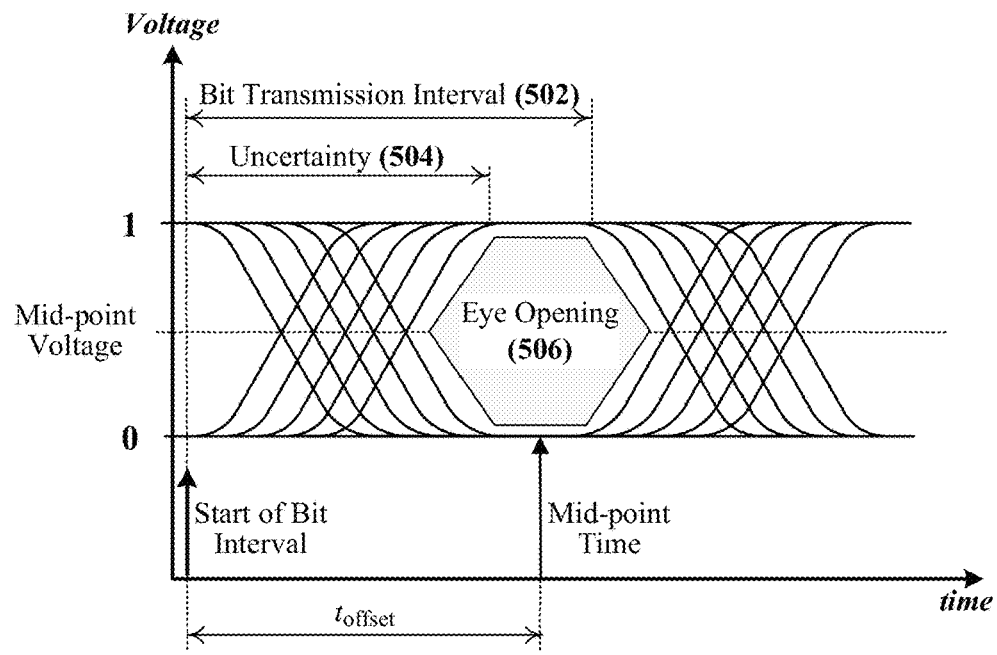
FIG. 5 illustrates an eye diagram generated as an overlay of signaling state for multiple bit transmissions.
Figure 5:
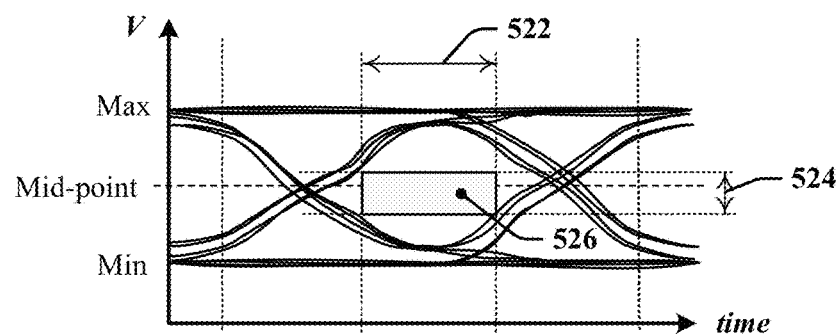

The window of stability during which data can be reliably sampled may be visualized in an eye-diagram. FIG. 5 illustrates one example of an eye diagram 500 generated as an overlay of signaling state for bit transmissions in multiple bit transmission intervals 502, which may also be referred to as UIs. In the illustrated example, a bit transmission can occur in one bit transmission interval 502 that spans a full cycle or half-cycle of a transmitter clock signal. A signal transition region 504 represents a time period of uncertainty at the boundary between two symbols where variable signal rise times prevent reliable decoding. State information may be determined reliably in a region defined by an eye opening 506 that encompasses the window of stability, and that represents the period of period in which signaling state is stable and the bit value can be reliably sampled and captured. The eye opening 506 may be used to define a region in which signal mid-point crossings do not occur. A receiver or decoder can be designed on the assumption that the eye opening 506 represents or delineates a window of stability in which signaling states can be reliably distinguished and in which information can be reliably sampled, demodulated or decoded from a data signal. The window of stability may be determined based on minimum and maximum voltage thresholds. The eye opening 506 may be narrowed along the time axis by increases in data rate and may be compressed in the voltage axis as a result of ISI and other types of interference and distortion. The eye opening 506 may be narrowed along the time axis when rise times or fall times for a data signal differ.

The concept of periodic sampling and overlaid display of the signal is a useful aid for the design, adaptation and configuration of systems that use clock and data recovery circuits. In some examples, clock and data recovery circuits are designed to re-create the received data-timing signal using frequent transitions detected in the received data. The eye opening 506 in an eye diagram 500 observed, simulated or computed as a basis for judging the ability of a clock and data recovery circuit to reliably recover data.

FIG. 5 also provides an example of an eye-diagram 520 that shows the combined effect of distortion and jitter on a data signal received from a high-speed serial data channel. In the illustrated example, a tradeoff between the height 524 and width 522 of the eye opening 526 may be needed to provide an adequate duration of time in which transitions can be reliably detected. Reductions in height 524 of the eye opening 526 may result from moving detection thresholds of the transitions of the received data signal to provide sufficient duration of time in which the data signal can be sampled. The width 522 of the eye opening 526 is determined in part by the variability in phase shift between in-phase and quadrature-phase clock signals. Increasing precision of the phase shift between in-phase and quadrature-phase clock signals can enable operation that produces an eye opening 526 with narrower width 522 and a correspondingly greater height 524.

An input/output circuit provided in accordance with certain aspects of this disclosure can be configured to offset channel losses and other distortions and enable reliable high-speed operation in LPDDR systems and other types of high-speed interfaces. Channel losses and other distortions can be offset or minimized by an equalization circuit embedded in a driver circuit. In some implementations, an equalization circuit embedded in a line driver can be configured to perform dynamic voltage frequency scaling (DVFS) and/or other equalization techniques while optimizing pad capacitance. DDRIO circuits provided in accordance with certain aspects of this disclosure circuits can be used to facilitate impedance matching. For example, a driver circuit equipped with an embedded equalization circuit can be configured to help match impedance presented by an SoC or DRAM to an interconnect or link that provides a data communication channel across different voltage frequency bands, and the driver circuit can minimize channel discontinuities and maximize performance of the data communication channel.

Figure 6:
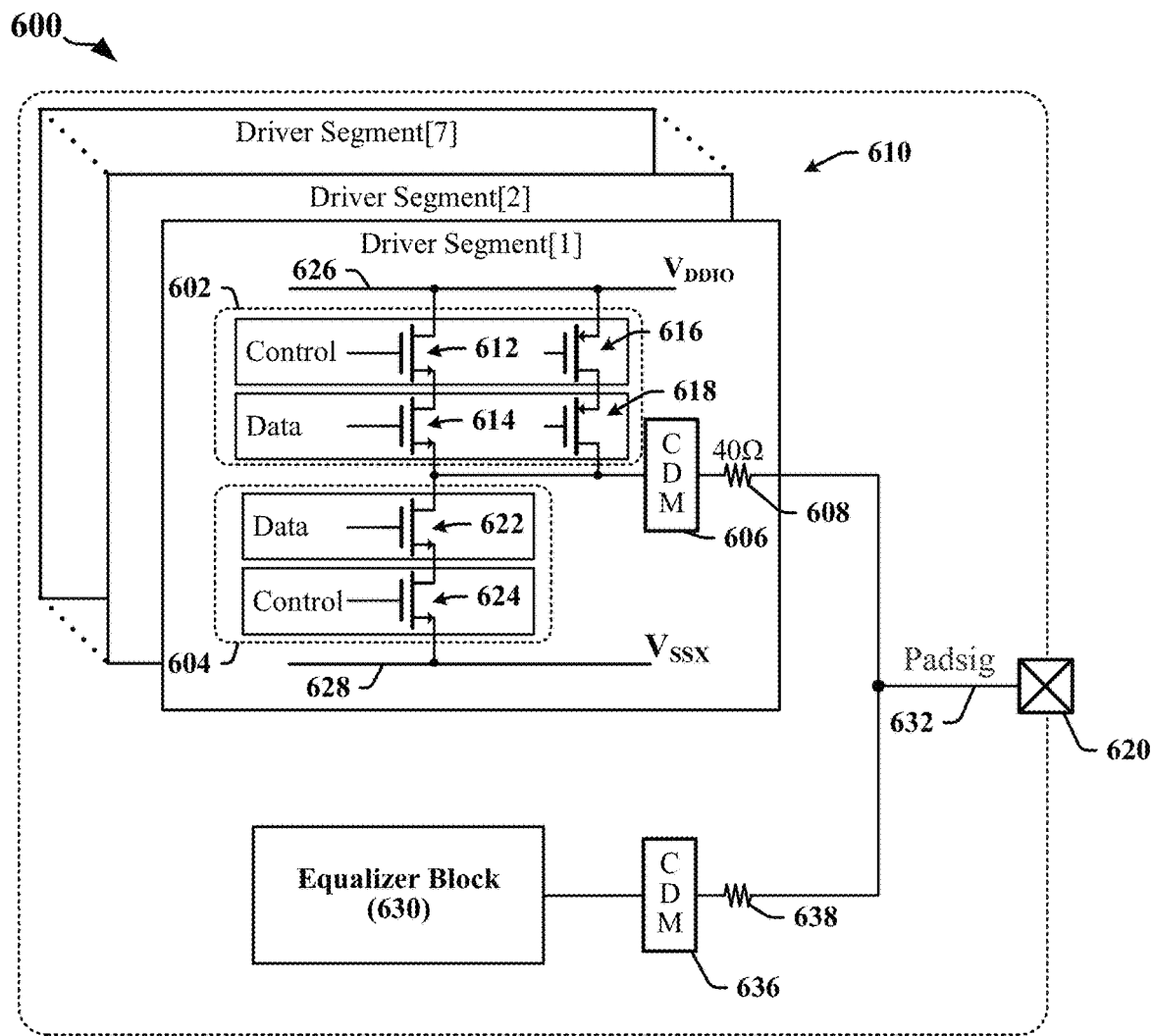
FIG. 6 illustrates certain aspects of the structure of an input/output circuit in a high-speed memory interface that may be adapted in accordance with certain aspects of this disclosure.
Figure 6:
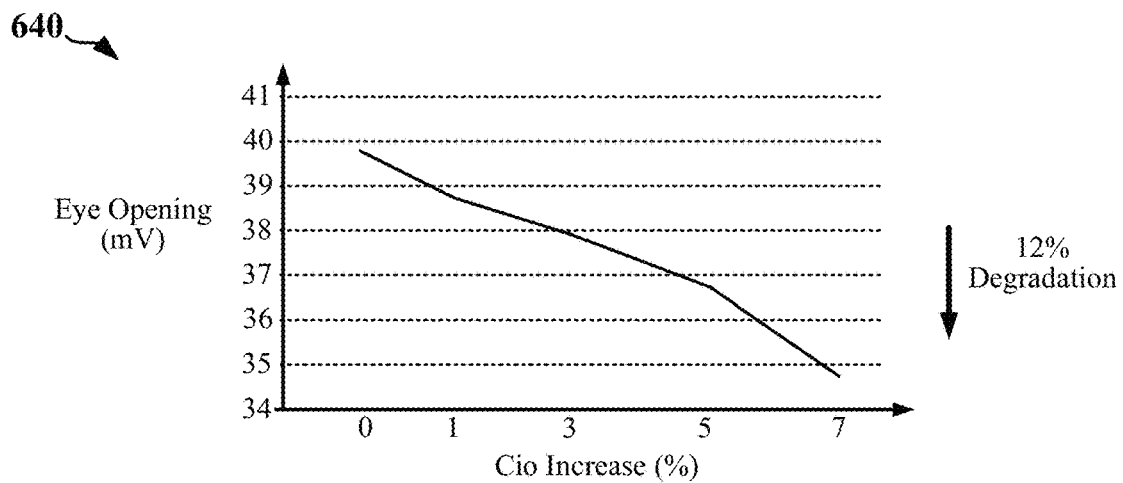

FIG. 6 illustrates the structure of a conventional DDRIO circuit 600, which may correspond in some respects to the DDRIO circuit 300 illustrated in FIG. 3 or to one of the DDRIO circuits $202_1$-$202_N$ illustrated in FIG. 2. The output of the illustrated DDRIO circuit 600 is provided at an I/O terminal 620. The illustrated DDRIO circuit 600 may correspond to one of the drivers $208_1$-$208_N$ illustrated in FIG. 2. In one example, the I/O terminal 620 is coupled to a data or control channel of a high-speed parallel bus that interconnects a memory controller and one or more memory devices. For the purposes of this description, the term I/O terminal may refer or correspond to a pad in an IC device or SoC that facilitates bonding or contacting with a connecting wire or other interconnect.

The DDRIO circuit 600 includes multiple driver segments 610 and an equalizer block 630. A first CDM-qualified ESD protection circuit 606 protects the driver segments 610, while a second CDM-qualified ESD protection circuit 636 protects the equalizer block 630. In the illustrated example, the first ESD protection circuit 606 and the driver segments 610 are coupled to the I/O terminal 620 through a first resistance 608 while the second ESD protection circuit 636 and the equalizer block 630 are coupled to the I/O terminal 620 through a second resistance 638. The number of driver segments 610 provided in the DDRIO circuit 600 may be determined by the characteristics of the data or control channel that is to be driven and by the nature and value of termination at the transmitting and/or or receiving devices. In the example of LPDDR SDRAM, the line or channel may be unterminated when low-power, lower-frequencies are transmitted. Lower frequency signals may be transmitted at higher voltage levels than higher frequency signals. Higher frequency signaling in LPDDR SDRAM applications may use signaling transmitted at near-ground voltage levels and line terminations may be provided.

The number of the driver segments 610 used for any selected operating mode may be calculated to provide a desired current or voltage level through the I/O terminal 620. In some instances, the number and nature of the driver segments 610 may be selected to meet a specified or desired transition time of edges in a signal (Padsig 632) to be transmitted through the I/O terminal 620. In some instances, the number and type of driver segments 610 may be dynamically selected based on the voltage level of a first power rail ($V_{DDIO}$ 626) that supplies the input/output circuits, as measured with respect to a second power rail ($V_{SSX}$ 628). Certain LPDDR specifications require that DDRIO circuits support aggressive core power rail voltage ($V_{DDA}$) scaling to support higher power optimization and to provide for voltage levels of $V_{DDIO}$ 626 that can vary. For example, $V_{DDIO}$ 626 may supply power at 0.5 Volts for lower-speed unterminated modes and at either 0.5 Volts or 0.3 Volts for higher-speed, terminated modes.

The driver segments 610 may be designed or configured to provide selectable drive strengths and/or to meet on-die DQ termination requirements. In the illustrated example, each of the driver segments 610 includes a pullup section 602 and a pulldown section 604. The pullup section 602 may include N-type metal-oxide-semiconductor (NMOS) transistors 612 and 614 and P-type metal-oxide-semiconductor (PMOS) transistors 616 and 618, which provide independently controlled pullup structures. The pulldown section 604 may include NMOS transistors 622 and 624 that are configured or selected to enable the DDRIO circuit 600 to meet a standards defined impedance target. In the illustrated example, the NMOS transistors 622 and 624 each provide a pulldown impedance of 240Ω. In one example, a pullup structure that includes PMOS transistors 616, 618 may be required in addition to a pullup structure that includes thin-oxide NMOS transistors 612, 614 to meet the minimum high output voltage level at lower speeds when the high output voltage level target is set at 0.5V and $V_{DDA}$ of the integrated circuit device is reduced. In the latter example, the pullup structure that includes the PMOS transistors 616, 618 may be disabled for high-speed, low output voltage target modes.

The bandwidth of the DDRIO circuit 600 is limited by channel loss and a channel RC constant calculated as the product of driver resistance and load capacitance ($R_{Driver} \times C_{Load}$) Each of the driver segments 610, the equalizer block 630 and the ESD protection circuits 606, 636 contributes to an I/O pad capacitance ($C_{IO}$) added by the DDRIO circuit 600 to the load capacitance. For the purposes of this discussion, $C_{IO}$ is measured at the I/O terminal 620. $C_{IO}$ can limit AC performance at higher frequencies. In one example, the addition of the equalizer block 630 can be expected to contribute approximately 10% of the overall I/O pad capacitance in certain SoCs configured to support LPDDR6 memory operation.

The illustrated DDRIO circuit 600 includes seven driver segments 610 and an equalizer block that includes a single equalizer segment. The equalizer block 630 may be configured to offset certain effects of $C_{IO}$ and other parameters that may introduce distortion and non-linear response of the DDRIO circuit 600 and line or channel. In some examples, the equalizer block 630 may be configured to effectively increase drive prior to, or during transmission of an edge or transition in Padsig 632 in order to mitigate for channel loss and linear intersymbol interference (ISI). ISI can distort signals when a pulse or an edge transmitted in a time interval (i.e., a unit interval or UI) is affected by a pulse or an edge transmitted in a preceding UI. The equalizer block 630 may enable the DDRIO circuit 600 to operate at, or switch between standards specified frequencies of 6.4 GHz and 4.8 GHz, for example.

The graph 640 in FIG. 6 illustrates the effect of increased $C_{IO}$ attributable to the inclusion of the equalizer block 630. The graph 640 plots the eye opening at the input to a memory device against increases in $C_{IO}$. In the illustrated example, which may relate to 6.4 GHz operation, eye opening is decreased or degraded by approximately 12% when the equalizer block 630 increases $C_{IO}$ by 8%.

Certain aspects of this disclosure relate to a DDRIO circuit that includes an equalizer that is integrated into one or more driver segments of the DDRIO circuit. In one aspect, the equalizer may be enabled for certain operational modes and/or operating frequencies of the DDRIO circuit. A DDRIO circuit implemented in accordance with certain aspects of this disclosure can operate without an external or separate equalizer circuit. In one example, an equalizer that is embedded in a driver segment of the DDRIO circuit can be configured to provide pre-emphasis drive to an output signal in advance of, or during transmission of an edge or transition in the output signal. Pre-emphasis may be provided using a one-shot equalization circuit that responds to transitions in a signal received by the driver segment for transmission over a high-speed serial bus. The equalizer can be embedded in the driver segment of the DDRIO circuit without significantly affecting the I/O capacitance at a pad through which the output signal is transmitted.

Figure 7:
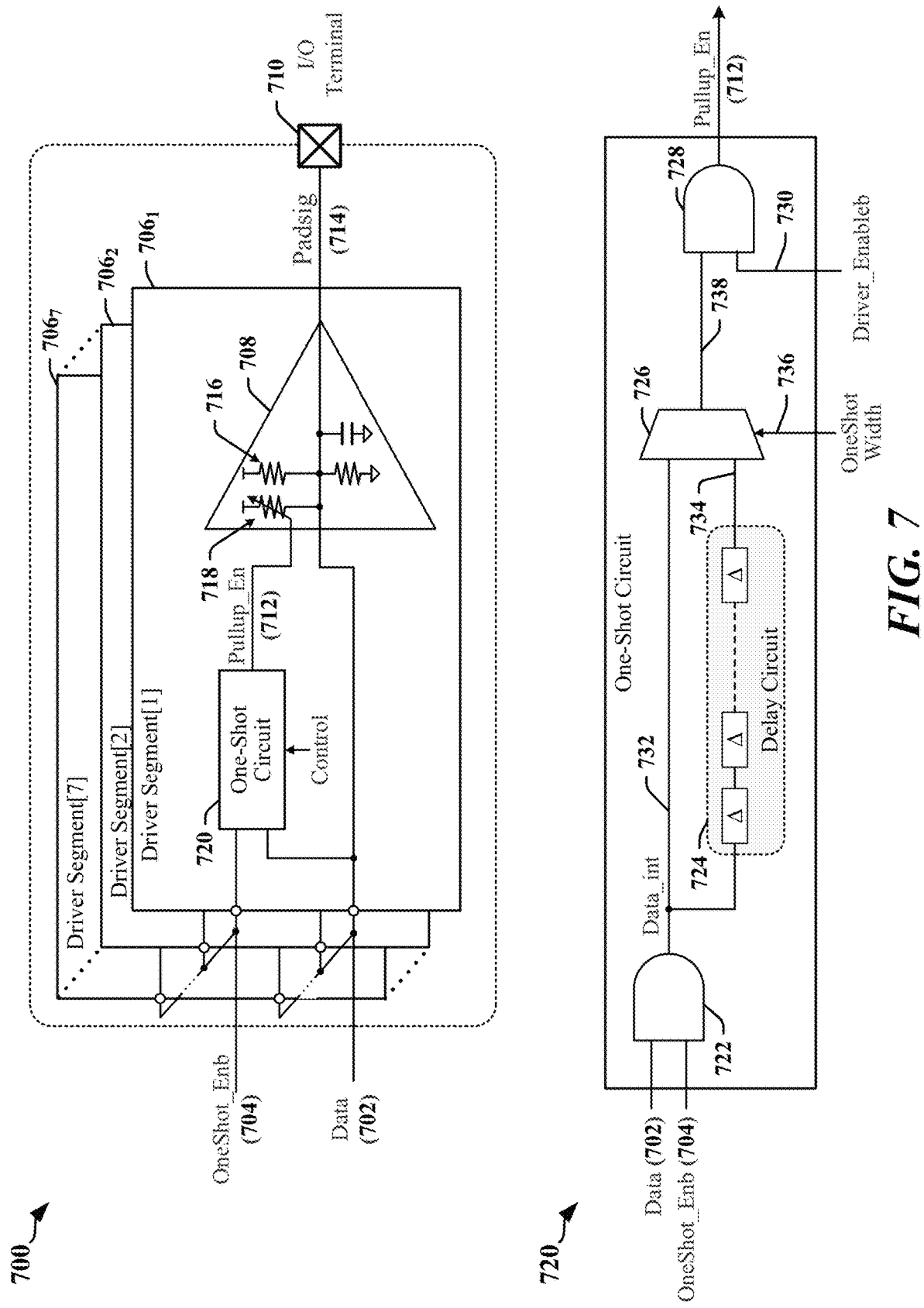
FIG. 7 includes a schematic representation of a high-speed driver circuit that includes one or more embedded, reconfigurable equalizers configured in accordance with certain aspects of this disclosure.

FIG. 7 includes a schematic representation of a DDRIO driver 700 that includes one or more embedded, reconfigurable equalizers that may be configured in accordance with certain aspects of this disclosure. The DDRIO driver 700 includes multiple driver circuits provided in parallel driver segments. In the illustrated example, the driver 700 includes seven driver segments 706₁-706₇, each driver segment 706₁-706₇ having an output coupled to an I/O terminal 710. Each driver segment 706₁-706₇ can be configured to contribute a drive current to an output signal (Padsig 714).

The illustrated driver segment 706₁ may be representative of all of the driver segments 706₁-706₇, although different driver segments 706₁-706₇ may controlled independently such that the drive strength of the DDRIO driver 700 and the I/O capacitance ($C_{IO}$) of the I/O terminal 710 can be configured based on operational mode of the DDRIO driver 700. The illustrated driver segment 706₁ includes a one-shot circuit 720 and a variable pullup structure 718 in line driver 708 that can be configured to provide a pre-emphasis drive current to Padsig 714 in certain operational modes of the DDRIO driver 700. In some instances, the one-shot circuit 720 responds to edges in a data signal 702 by generating a pulse in a pullup enable signal 712 when one-shot equalization is enabled. The variable pullup structure 718 can increase drive current provided to the Padsig 714 when enabled by the presence of the pulse in the pullup enable signal 712. The duration, phase and other timing aspects of the pulse may be configured or calibrated during initialization or during transitions between operating modes. An enable signal 704 may enable or disable the operation of the one-shot circuit 720 and may prevent activation of the variable pullup structure 718. In some operational modes, the one-shot circuit 720 may be configured by control signals 704, 730, 736 that may, for example, activate the variable pullup structure 718 and/or cause the variable pullup structure 718 to augment the drive provided by other pullup structures 716 in the line driver 708 by transmitting a version of the data signal 702.

FIG. 7 illustrates an example of a one-shot circuit 720 that may be implemented in a DDRIO driver 700 in accordance with certain aspects of this disclosure. The one-shot circuit 720 receives the data signal 702 and a control signal (OneShot_Enb signal 704). In the illustrated example, the data signal 702 is gated by OneShot_Enb signal 704 using an AND gate 722. The data signal 702 is propagated through the AND gate 722 (as the Data_int signal 732) when OneShot_Enb signal 704 is in a first, enabling signaling state and blocked when OneShot_Enb signal 704 is in a second, disabling state. When disabled, the output of the one-shot circuit 720 may be driven to a signaling state that disables the variable pullup structure 718. The variable pullup structure 718 may be disabled by causing it to enter a high impedance state, for example.

Figure 8:
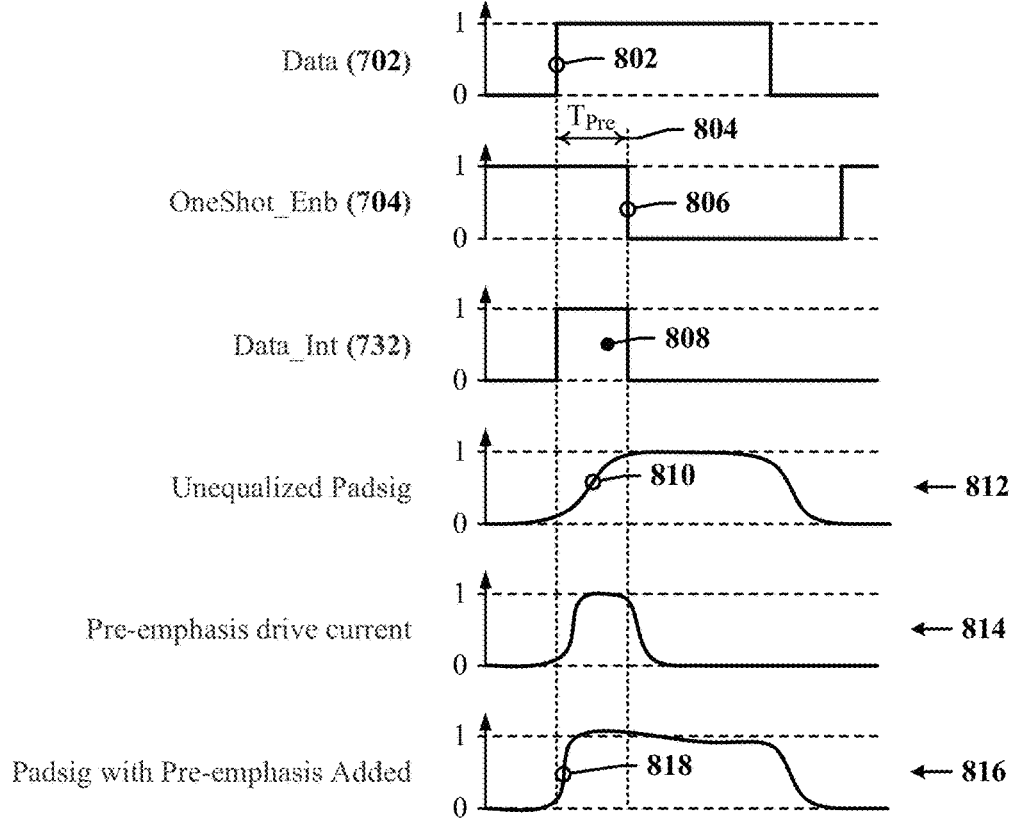
FIG. 8 illustrates certain aspects of the operation of the high-speed driver circuit illustrated in FIG. 7.
Figure 8:
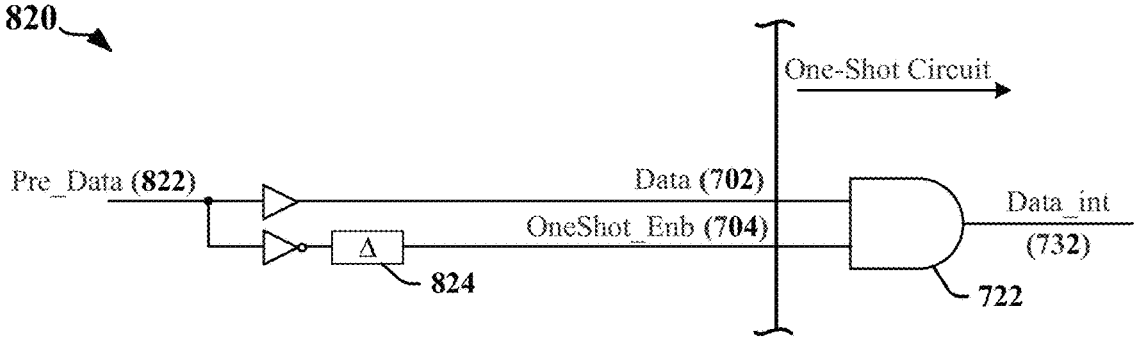

Reference is also made to FIG. 8, which illustrates certain aspects of the operation of the DDRIO driver 700. In accordance with certain aspects of this disclosure, the OneShot_Enb signal 704 may be used to generate a pulse in the Data_int signal 732. In one example, the OneShot_Enb signal 704 may be provided as an inverted delayed version of the data signal 702. The schematic drawing 820 in FIG. 8 illustrates the use of delay element 824 to obtain the data signal 702 and the OneShot_Enb signal 704 from an output of a preamplifier that provides a base data signal 822. In one example, the delay element is provided by a set of series connected gates. The timing of the data signal 702 and the OneShot_Enb signal 704 causes the output of the AND gate 722 to switch to a high signaling state for a short duration commencing with a rising edge 802 in the data signal 702, as illustrated by the timing diagrams 800 provided in FIG. 8. The OneShot_Enb signal 704, being the inverted delayed of the data signal 702, is in the high signaling state when the rising edge 802 in the data signal 702 occurs. The AND gate 722 drives Data_int signal 732 to the high signaling state when both the data signal 702 and the OneShot_Enb signal 704 are in the high state. After a delay ($T_{Pre}$ 804) that corresponds to the delay between the data signal 702 and the OneShot_Enb signal 704, the OneShot_Enb signal 704 transitions 806 to a low signaling state and the AND gate 722 drives Data_int signal 732 to the low signaling state. The resultant pulse 808 in the Data_int signal 732 may be used to activate the variable pullup structure 718 in line driver 708 for a short duration of time.

The timing diagrams 800 also illustrate an example of the effect of pre-emphasis on Padsig 714, which is transmitted by the DDRIO driver 700 of FIG. 7. Timing diagram 812 illustrates an example of Padsig 714 when no pre-emphasis equalization is applied. The relatively slow rising edge 810 in an unequalized Padsig 714 can negatively impact the height of the eye opening observed at a receiver. Timing diagram 814 illustrates the timing of a drive current or increased voltage applied to Padsig while the pulse 808 is present in the Data_int signal 732. Timing diagram 816 illustrates Padsig 714 with an improved, faster rising edge 818 with added pre-emphasis equalization when the pulse 808 is present in the Data_int signal 732.

In the illustrated example, the Data_int signal 732 is provided to a first input of a multiplexer 726 and a delay circuit 724. The output 734 of the delay circuit 724 is received at one or more other inputs of the multiplexer 726. In some implementations, the delay circuit 724 can be used to calibrate the timing of the pulse 808 in the Data_int signal 732. For example, the delay circuit 724 may be configured to delay the Data_int signal 732 using a series of logic gates that can adjust the timing of the pulse 808 to match propagation delays affecting the data signal 702. In the latter example, the data signal 702 may be coupled to the line driver 708 through a series of buffers that each introduce a gate delay that can be matched by the delay circuit 724. The multiplexer 726 may respond to a control signal 736 that selects between the Data_int signal 732 and a delayed version of the Data_int signal 732 provided by the delay circuit 724. In some implementations, the delay circuit 724 provides multiple delayed versions of the Data_int signal 732 to the multiplexer 726 that enable fine tuning of the timing of the pulse 808 with respect to edges in the data signal 702.

In some implementations, the OneShot_Enb signal may be used as a control signal that can enable or disable the operation of the one-shot circuit 720. In some of these implementations, the delay circuit 724 or an associated circuit generates pulses with different durations. The Data_int signal 732 in these implementations is a gated version of the data signal 702. The multiplexer 726 receives a multi-signal output 734 from the delay circuit 724 and responds to a multi-bit control signal 736 by selecting an output 738 from among the Data_int signal 732 and the multiple signals output by the delay circuit 724. The multiplexer 726 may provide a version of the data signal 702 or a selectable duration pre-emphasis pulse to enable the variable pullup structure 718 in the line driver 708. In one example, the version of the data signal 702 may be provided to the variable pullup structure 718 when the line driver 708 is operated at lower frequencies and a pulse of desired duration may be provided to the variable pullup structure 718 when the line driver 708 is operated at higher frequencies.

In certain implementations, the delay circuit 724 may be configured to generate or provide versions of pulses with different durations and different widths at its output 734. An output gate 728 responsive to an external control signal that enables or disables the variable pullup structure 718 regardless of the state or operation of the one-shot circuit 720. For example, a controller may provide a global driver enable signal (Driver_Enableb 730) for the memory interface that enables at least the variable pullup structure 718 in all DDRIO circuits to be disabled.

Figure 9:
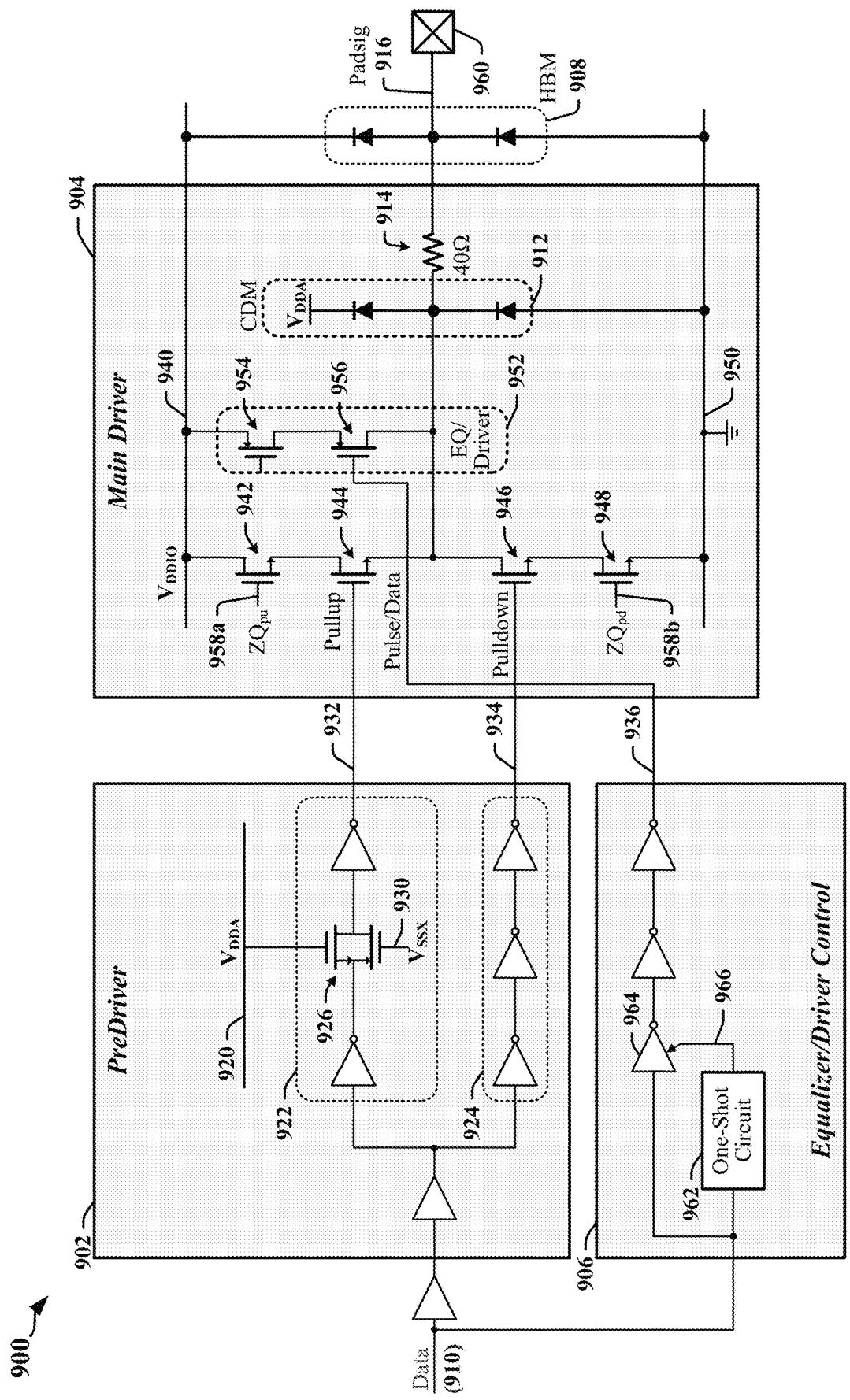
FIG. 9 illustrates certain aspects of a driver segment in a high-speed driver circuit provided and configured in accordance with certain aspects of this disclosure.

FIG. 9 is circuit diagram illustrating an example of a driver segment 900 of a DDRIO circuit that is configured in accordance with certain aspects of this disclosure. The driver segment 900 includes a pre-driver stage 902, a main driver stage 904 and a control circuit 906. The pre-driver stage 902 illustrates an interface between a low voltage core of an SoC or other IC device and the higher-voltage DDRIO circuit in which the main driver stage 904 is provided. The control circuit can be configured in some modes of operation to provide pre-emphasis control signaling when one-shot pre-emphasis equalization is enabled and/or to enable supplemental driving for lower speed modes of operation when power supplies in the DDRIO circuit are provided at higher voltages. The driver segment 900 is coupled to an input data signal 910 and transmits an output signal (Padsig 916) through an I/O terminal 960, where Padsig 916 is an amplified or repeated version of the input data signal 910. The illustrated driver segment 900 includes a CDM-qualified ESD protection circuit 912 and an HBM-qualified ESD protection circuit 908 that are coupled to the I/O terminal 960. The CDM-qualified ESD protection circuit 912 and the HBM-qualified ESD protection circuit 908 are coupled to one another using a resistive component 914.

The main driver stage 904 receives a pullup data signal 932 and a pulldown data signal 934, which are both derived from the input data signal 910. The pullup data signal 932 and the pulldown data signal 934 are configured by the pre-driver stage 902 to drive the gates of respective pullup and pulldown drive transistors 944, 946 without exceeding voltage limits for the pullup and pulldown drive transistors 944, 946. In the illustrated example, the pullup transistor 944 is configured to selectively pull Padsig 916 to the voltage ($V_{DDIO}$ 940) of the power supply provided to the DDRIO circuit, while the pulldown transistor 946 is configured to selectively pull Padsig 916 to the ground or common voltage 950 of the power supply provided to the DDRIO circuit. The pullup transistor 944 is coupled to $V_{DDIO}$ 940 through a pullup enable transistor 942, while the pulldown transistor 946 is coupled to the ground or common voltage 950 through a pulldown enable transistor 948. The pullup enable transistor 942 and pulldown enable transistor 948 are gated by respective enable signals 958a, 958b that can be switched off to present a high impedance to the I/O terminal 960 when the driver segment 900 is to be disabled. The pullup enable transistor 942 and pulldown enable transistor 948 present a low impedance when enabled. In some instances, one or more of the enable signals 958a and/or 958b may be configured to provide a desired channel resistance in the respective pullup enable transistor 942 and/or pulldown enable transistor 948.

The pre-driver stage 902 includes buffer circuits 922, 924 that are adapted or configured to generate the pullup data signal 932 and the pulldown data signal 934 from the input data signal 910. The buffer circuits 922, 924 may operate to cause the pullup data signal 932 and the pulldown data signal 934 to switch between the core power voltage rails, which are designated as $V_{DDA}$ 920 and $V_{SSX}$ 930 in FIG. 9. In LPDDR systems, $V_{DDA}$ 920 may be subject to aggressive power scaling requirements, and the voltage level of $V_{DDA}$ 920 may vary considerably to meet these scaling requirements. A buffered, in-phase version of the input data signal 910 is provided to the pullup transistor 944, which is implemented as an NMOS transistor in the illustrated pre-driver stage 902. Accordingly, the pullup transistor 944 is turned on and pulls Padsig 916 to the high signaling state when the input data signal 910 is in a high signaling state. A buffered, inverse version of the input data signal 910 is provided to the pulldown transistor 946, which is implemented as an NMOS transistor in the illustrated pre-driver stage 902. Accordingly, the pulldown transistor 946 is turned on and pulls Padsig 916 to the low signaling state when the input data signal 910 is in a low signaling state.

The pre-driver stage 902 includes a pass gate circuit 926, which may be provided to help match delays in the pullup data signal 932 with delays in the pulldown data signal 934. In some implementations, the pass gate circuit 926 may provide protection to low-voltage transistors from the voltage differentials introduced by power scaling. In some implementations, the pass gate circuit 926 may protect low-voltage transistors from ESD events. In one example, the pass gate circuit 926 in the pullup buffer circuit 922 may be provided to avoid leakage when power scaling or an ESD event affects two or more power rails.

A reconfigurable pullup structure 952 in the main driver stage 904 is controlled by the control circuit 906. The control circuit 906 includes a one-shot circuit 962 and a gated buffer 964. The input data signal 910 is propagated to the one-shot output signal 936 through the gated buffer 992 when a gating signal 966 is in a first, enabling signaling state. The gated buffer 992 blocks the input data signal 910 from the one-shot output signal 936 when the gating signal 966 is in a second, disabling signaling state. In the illustrated example, the gated buffer 964 operates as an inverter when enabled by the gating signal 966 such that an inverted version of the input data signal 910 is provided to an PMOS transistor 956 in the reconfigurable pullup structure 952. The PMOS transistor 956 is turned on and pulls Padsig 916 to the high signaling state when the input data signal 910 is in the high signaling state and when a second PMOS transistor 954 is turned on by an enabling signal. In some examples, the latter enabling signal is derived from the enable signal 958a coupled to the gate of the pullup enable transistor 942.

In some implementations, the one-shot circuit 962 may produce a gating signal 966 that is an inverted delayed version of the input data signal 910. With reference again to the timing diagrams 800 of FIG. 8, the input data signal 910 and the gating signal 966 data signal may correspond to the data signal 702 and OneShot_Enb signal 704 illustrated in FIG. 8. In some implementations, the one-shot circuit 962 may be configured in accordance with the one-shot circuit 720 illustrated in FIG. 7. In other implementations, the one-shot circuit 962 may be implemented as a pulse generator using a combination of circuits such as delay elements, multiplexers, flipflops and combinational logic.

According to certain aspects of this disclosure the control circuit 906 and the main driver stage 904 may cooperate to provide a combination circuit that operates in a first mode as an embedded, reconfigurable equalizer within the illustrated driver segment 900 and as a PMOS pull-up driver in a second mode of operation. In certain implementations, the PMOS transistors 954, 956 in the reconfigurable pullup structure 952 are implemented using thin-oxide technology and can support one-shot equalization when the driver segment 900 is operated at higher frequencies. The PMOS transistors 954, 956 may also be used to provide additional drive capability in order to meet nominal high output voltage ($V_{OH}$) targets at lower frequencies and when $V_{DDA}$ 920 is provided at low voltage levels. In one example, the higher frequencies at which the driver segment 900 may refer to I/O bus clock frequencies specified for LPDDR6 or LPDDR6x memory, including frequencies of 4.8 GHz, 6.4 GHz or higher. Lower frequencies may include I/O bus clock frequencies of 200 MHz-4.3 GHz, for example. The NMOS transistors 942, 944 may be implemented using thick-oxide technology. It is contemplated that the concepts disclosed herein can be implemented using various combinations of thick-oxide NMOS transistors, thin-oxide NMOS transistors, thick-oxide POS transistors, thick-oxide PMOS transistors.

According to one aspect, the reconfigurable pullup structure 952 can enable the driver segment 900 to support dynamic voltage frequency scaling (DVFS). According to one aspect, the reconfigurable pullup structure 952 can minimize or optimize pad capacitance observed at the I/O terminal 960 and within the driver segment 900. It can be expected that a reduction in capacitance will be obtained by the elimination of separate equalizer circuits and by the use of the reconfigurable pullup structure 952 in equalizer mode, driver mode, and other modes. Reductions in pad capacitance can amount to 8% or more.

According to one aspect, implementation of the reconfigurable pullup structure 952 to be used for one-shot equalization can reduce the area of an IC or SoC allocated for a DDRIO driver by 10% or more. In certain implementations, the improvement in eye-height at the receiver resulting from the presently-disclosed one-shot equalization circuit lies between 10%-16%, with greater improvement expected in some instances.

A reconfigurable driver in an I/O circuit provided in accordance with certain aspects of this disclosure may have a first transistor provided in a first pullup structure, a second transistor provided in a second pullup structure, and a control circuit that generates a control signal provided to a gate of the second transistor. The first transistor has a gate configured to receive a data signal that is propagated from an input of the driver. In some examples, the second transistor may be a thin-oxide PMOS transistor. The first transistor may be a thin-oxide NMOS transistor.

The control circuit has an input configured to receive the data signal and is configured to generate the control signal using an inverted, delayed version of the data signal when the second pullup structure is operated in a first mode, and maintain the control signal in a signaling state that turns off the second transistor when the second pullup structure is operated in a second mode. The control circuit may be further configured to generate the control signal by propagating a version of the data signal to the gate of the second transistor when the second pullup structure is operated in a third mode.

The second pullup structure may be used to provide one-shot equalization to an output of the reconfigurable driver when the second pullup structure is operated in the first mode. The data signal may have a higher frequency when the second pullup structure is operated in the first mode than when the second pullup structure is operated in the third mode. The data signal may be received at a frequency of at least 4.8 gigahertz when the second pullup structure is operated in the first mode.

In some implementations, the control signal is configured to cause the first transistor to pull an output of the reconfigurable driver toward a high voltage level while the data signal is at a first signaling state. The control signal may be configured to cause the second transistor to pull the output of the reconfigurable driver toward the high voltage level commencing at a transition of the data signal from a second signaling state to the first signaling state. The control signal may be configured to turn off the second transistor before the data signal returns to the second signaling state.

In some implementations, the second transistor is turned off after a delay following a transition of the data signal from a first signaling state to a second signaling state when the second pullup structure is operated in the first mode. The delay duration may correspond to the duration of the delay applied the control circuit to the data signal when the control signal is being generated and when the second pullup structure is operated in the first mode.

The first pullup structure and the second pullup structure are provided in one of a plurality of reconfigurable drivers coupled to an output terminal of a transmitting device in a LPDDR memory. The DDRIO driver 700 illustrated in FIG. 7 shows an example in which a plurality of reconfigurable drivers is coupled to an I/O terminal 710 of a transmitting device in LPDDR memory.

Figure 10:
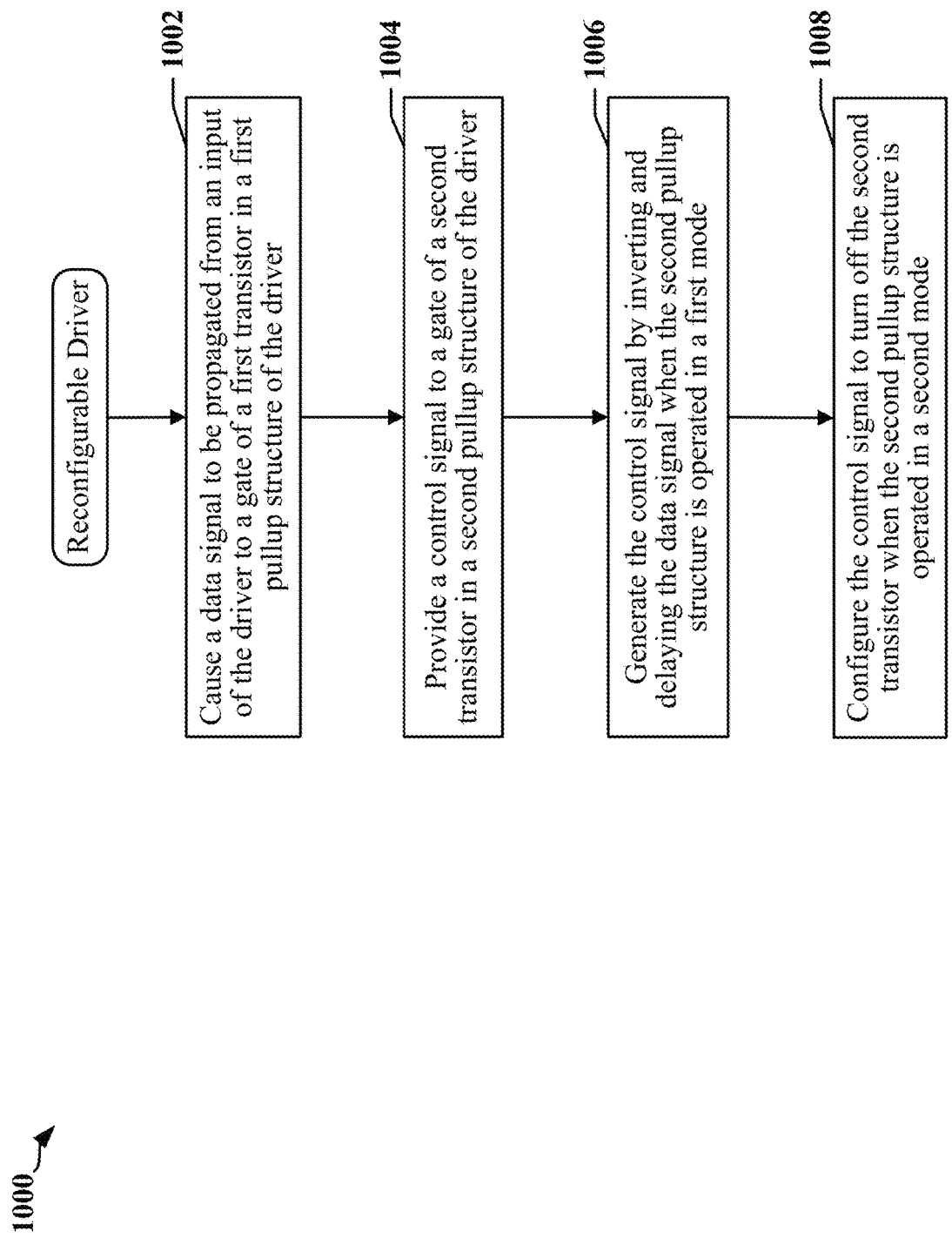
FIG. 10 is a flowchart illustrating an example of a method for reconfiguring a driver in a high-speed driver circuit provided in accordance with certain aspects of this disclosure.

FIG. 10 is a flowchart 1000 illustrating an example of a method for reconfiguring a driver in an I/O circuit. The method may be implemented by a controller in a driver that is coupled to data communication link. In one example, the receiver may include the driver segment 900 illustrated in FIG. 9.

At block 1002, the controller may cause a data signal to be propagated from an input of the driver to a gate of a first transistor in a first pullup structure of the driver. At block 1004, the controller may cause a control signal to be propagated to a gate of a second transistor in a second pullup structure of the driver. At block 1006, the controller may cause the control signal to be generated by a circuit that is configured to invert and delay the data signal when the second pullup structure is operated in a first mode. At block 1008, the controller may cause the control signal to be configured to turn off the second transistor when the second pullup structure is operated in a second mode. In some implementations, the second pullup structure provides one-shot equalization to an output of the driver when the second pullup structure is operated in the first mode. In some examples, the second transistor is implemented as a thin-oxide PMOS transistor. The first transistor may be implemented as a thick-oxide NMOS transistor. In some examples, the first pullup structure and the second pullup structure are provided in one of a plurality of reconfigurable drivers coupled to an output terminal of a transmitting device in a LPDDR SDRAM.

In certain implementations, the controller may cause the control signal to be generated by propagating a version of the data signal to the gate of the second transistor when the second pullup structure is operated in a third mode. The data signal may have a higher frequency when the second pullup structure is operated in the first mode than when the second pullup structure is operated in the third mode. The data signal may have a frequency of at least 4.8 gigahertz when the second pullup structure is operated in the first mode.

In certain implementations, the control signal is configured to cause the first transistor to pull an output of the driver toward a high voltage level while the data signal is at a first signaling state. The control signal may be configured to cause the second transistor to pull the output of the driver toward the high voltage level commencing at a transition of the data signal from a second signaling state to the first signaling state. The control signal may be configured to turn off the second transistor before the data signal returns to the second signaling state.

In certain implementations, the control signal is configured to turn off the second transistor after a delay following a transition of the data signal from a first signaling state to a second signaling state when the second pullup structure is operated in the first mode. The delay duration may correspond to the duration of the delay applied to the data signal when the control signal is being generated and when the second pullup structure is operated in the first mode.

The operational steps described in any of the exemplary aspects herein are described to provide examples. The operations described may be performed in numerous different sequences other than the illustrated sequences. Furthermore, operations described in a single operational step may actually be performed in a number of different steps. Additionally, one or more operational steps discussed in the exemplary aspects may be combined. It is to be understood that the operational steps illustrated in the flow diagrams may be subject to numerous different modifications as will be readily apparent to one of skill in the art. Those of skill in the art will also understand that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

The various operations of methods described above may be performed by any suitable means capable of performing the corresponding functions. The means may include various hardware and/or software component(s) and/or module(s), including, but not limited to a circuit, an application-specific integrated circuit (ASIC), or processor. Generally, where there are operations illustrated in figures, those operations may have corresponding counterpart means-plus-function components with similar numbering.

In one example aspects, an apparatus includes means for propagating a data signal from an input of a driver in an I/O circuit to a gate of a first transistor in a first pullup structure of the driver, and means for generating a control signal that is provided to a gate of a second transistor in a second pullup structure of the driver. The means for generating the control signal may be configured to generate the control signal by inverting and delaying the data signal when the second pullup structure is operated in a first mode. The control signal may be configured to turn off the second transistor when the second pullup structure is operated in a second mode. In some examples, the second transistor is implemented as a thin-oxide PMOS transistor. The first transistor may be implemented as a thick-oxide NMOS transistor. In some examples, the first pullup structure and the second pullup structure are provided in one of a plurality of reconfigurable drivers coupled to an output terminal of a transmitting device in a LPDDR SDRAM. In one example, the second pullup structure provides one-shot equalization to an output of the driver when the second pullup structure is operated in the first mode.

In certain implementations, the means for generating the control signal is configured to propagate a version of the data signal to the gate of the second transistor when the second pullup structure is operated in a third mode. The data signal can have a higher frequency when the second pullup structure is operated in the first mode than when the second pullup structure is operated in the third mode. The data signal may have a frequency of at least 4.8 gigahertz when the second pullup structure is operated in the first mode.

In certain implementations, the control signal can be configured to cause the first transistor to pull an output of the driver toward a high voltage level while the data signal is at a first signaling state. The control signal may be configured to cause the second transistor to pull the output of the driver toward the high voltage level commencing at a transition of the data signal from a second signaling state to the first signaling state. The control signal may be configured to turn off the second transistor before the data signal returns to the second signaling state.

In some implementations, the means for generating the control signal is configured to configure the control signal to turn off the second transistor after a delay following a transition of the data signal from a first signaling state to a second signaling state when the second pullup structure is operated in the first mode. The delay duration may correspond to the duration of the delay applied to the data signal when the control signal is being generated and when the second pullup structure is operated in the first mode.

Some implementation examples are described in the following numbered clauses:

1. A reconfigurable driver in an input/output (I/O) circuit comprising: a first transistor provided in a first pullup structure, the first transistor having a gate configured to receive a data signal that is propagated from an input of the driver; a second transistor provided in a second pullup structure, the second transistor having a gate coupled to a control signal; and a control circuit that generates the control signal and that has an input configured to receive the data signal, the control circuit being configured to: generate the control signal using an inverted, delayed version of the data signal when the second pullup structure is operated in a first mode; and maintain the control signal in a signaling state that turns off the second transistor when the second pullup structure is operated in a second mode.

2. The reconfigurable driver as described in clause 1, wherein the second pullup structure provides one-shot equalization to an output of the reconfigurable driver when the second pullup structure is operated in the first mode.

3. The reconfigurable driver as described in clause 1 or clause 2, wherein the control circuit is further configured to: generate the control signal by propagating a version of the data signal to the gate of the second transistor when the second pullup structure is operated in a third mode.

4. The reconfigurable driver as described in clause 3, wherein the data signal has a higher frequency when the second pullup structure is operated in the first mode than when the second pullup structure is operated in the third mode.

5. The reconfigurable driver as described in clause 4, wherein the data signal has a frequency of at least 4.8 gigahertz when the second pullup structure is operated in the first mode.

6. The reconfigurable driver as described in any of clauses 1-5, wherein the second transistor comprises a thin-oxide P-type metal-oxide-semiconductor (PMOS) transistor.

7. The reconfigurable driver as described in any of clauses 1-6, wherein the first transistor comprises a thin-oxide N-type metal-oxide-semiconductor (NMOS) transistor.

8. The reconfigurable driver as described in any of clauses 1-7, wherein the control signal is configured to cause the first transistor to pull an output of the reconfigurable driver toward a high voltage level while the data signal is at a first signaling state, wherein the control signal is configured to cause the second transistor to pull the output of the reconfigurable driver toward the high voltage level commencing at a transition of the data signal from a second signaling state to the first signaling state, and wherein the control signal is configured to turn off the second transistor before the data signal returns to the second signaling state.

9. The reconfigurable driver as described in any of clauses 1-8, wherein the second transistor is turned off after a delay following a transition of the data signal from a first signaling state to a second signaling state when the second pullup structure is operated in the first mode, and wherein the delay is determined by timing of the control signal generated by the control circuit when the second pullup structure is operated in the first mode.

10. The reconfigurable driver as described in any of clauses 1-9, wherein the first pullup structure and the second pullup structure are provided in one of a plurality of reconfigurable drivers coupled to an output terminal of a transmitting device in a low-power double data rate synchronous dynamic random access memory.

11. An apparatus comprising: means for propagating a data signal from an input of a driver in an input/output circuit to a gate of a first transistor in a first pullup structure of the driver; and means for generating a control signal that is provided to a gate of a second transistor in a second pullup structure of the driver, wherein the means for generating the control signal is configured to generate the control signal by inverting and delaying the data signal when the second pullup structure is operated in a first mode, and wherein the control signal is configured.

12. The apparatus as described in clause 11, wherein the second pullup structure provides one-shot equalization to an output of the driver when the second pullup structure is operated in the first mode.

13. The apparatus as described in clause 11 or clause 12, wherein the means for generating the control signal is configured to propagate a version of the data signal to the gate of the second transistor when the second pullup structure is operated in a third mode.

14. The apparatus as described in clause 13, wherein the data signal has a higher frequency when the second pullup structure is operated in the first mode than when the second pullup structure is operated in the third mode.

15. The apparatus as described in clause 14, wherein the data signal has a frequency of at least 4.8 gigahertz when the second pullup structure is operated in the first mode.

16. The apparatus as described in any of clauses 11-15, wherein the second transistor comprises a thin-oxide P-type metal-oxide-semiconductor (PMOS) transistor.

17. The apparatus as described in any of clauses 11-16, wherein the first transistor comprises a thin-oxide N-type metal-oxide-semiconductor (NMOS) transistor.

18. The apparatus as described in any of clauses 11-17, wherein the control signal is configured to cause the first transistor to pull an output of the driver toward a high voltage level while the data signal is at a first signaling state, wherein the control signal is configured to cause the second transistor to pull the output of the driver toward the high voltage level commencing at a transition of the data signal from a second signaling state to the first signaling state, and wherein the control signal is configured to turn off the second transistor before the data signal returns to the second signaling state.

19. The apparatus as described in any of clauses 11-18, wherein the means for generating the control signal is configured to: configure the control signal to turn off the second transistor after a delay following a transition of the data signal from a first signaling state to a second signaling state when the second pullup structure is operated in the first mode, wherein the delay is used by the means for generating the control signal to delay the data signal when generating the control signal.

20. The apparatus as described in any of clauses 11-19, wherein the first pullup structure and the second pullup structure are provided in one of a plurality of reconfigurable drivers coupled to an output terminal of a transmitting device in a low-power double data rate synchronous dynamic random access memory.

21. A method for reconfiguring a driver in an input/output circuit, comprising: causing a data signal to be propagated from an input of the driver to a gate of a first transistor in a first pullup structure of the driver; providing a control signal to a gate of a second transistor in a second pullup structure of the driver; generating the control signal by inverting and delaying the data signal when the second pullup structure is operated in a first mode; and configuring the control signal to turn off the second transistor when the second pullup structure is operated in a second mode.

22. The method as described in clause 21, wherein the second pullup structure provides one-shot equalization to an output of the driver when the second pullup structure is operated in the first mode.

23. The method as described in clause 21 or clause 22, further comprising: generating the control signal by propagating a version of the data signal to the gate of the second transistor when the second pullup structure is operated in a third mode.

24. The method as described in clause 23, wherein the data signal has a higher frequency when the second pullup structure is operated in the first mode than when the second pullup structure is operated in the third mode.

25. The method as described in clause 24, wherein the data signal has a frequency of at least 4.8 gigahertz when the second pullup structure is operated in the first mode.

26. The method as described in any of clauses 21-25, wherein the second transistor comprises a thin-oxide P-type metal-oxide-semiconductor (PMOS) transistor.

27. The method as described in any of clauses 21-26, wherein the first transistor comprises a thin-oxide N-type metal-oxide-semiconductor (NMOS) transistor.

28. The method as described in any of clauses 21-27, wherein the control signal is configured to cause the first transistor to pull an output of the driver toward a high voltage level while the data signal is at a first signaling state, wherein the control signal is configured to cause the second transistor to pull the output of the driver toward the high voltage level commencing at a transition of the data signal from a second signaling state to the first signaling state, and wherein the control signal is configured to turn off the second transistor before the data signal returns to the second signaling state.

29. The method as described in any of clauses 21-28, further comprising: configuring the control signal to turn off the second transistor after a delay following a transition of the data signal from a first signaling state to a second signaling state when the second pullup structure is operated in the first mode, wherein the delay is used to delay the data signal when generating the control signal when the second pullup structure is operated in the first mode.

30. The method as described in any of clauses 21-29, wherein the first pullup structure and the second pullup structure are provided in one of a plurality of reconfigurable drivers coupled to an output terminal of a transmitting device in a low-power double data rate synchronous dynamic random access memory.

As used herein, a phrase referring to "at least one of" a list of items refers to any combination of those items, including single members. As an example, "at least one of: a, b, or c" is intended to cover a, b, c, a-b, a-c, b-c, and a-b-c, as well as any combination with multiples of the same element (e.g., a-a, a-a-a, a-a-b, a-a-c, a-b-b, a-c-c, b-b, b-b-b, b-b-c, c-c, and c-c-c or any other ordering of a, b, and c).

The present disclosure is provided to enable any person skilled in the art to make or use aspects of the disclosure. Various modifications to the disclosure will be readily apparent to those skilled in the art, and the generic principles defined herein may be applied to other variations without departing from the spirit or scope of the disclosure. Thus, the disclosure is not intended to be limited to the examples and designs described herein, but is to be accorded the widest scope consistent with the principles and novel features disclosed herein.

What is claimed is:

1. A reconfigurable driver in an input/output (I/O) circuit comprising:
    a first transistor provided in a first pullup structure, the first transistor having a gate configured to receive a data signal that is propagated from an input of the driver;
    a second transistor provided in a second pullup structure, the second transistor having a gate coupled to a control signal; and
    a control circuit that generates the control signal and that has an input configured to receive the data signal, the control circuit being configured to:
        generate the control signal using an inverted, delayed version of the data signal when the second pullup structure is operated in a first mode; and
        maintain the control signal in a signaling state that turns off the second transistor when the second pullup structure is operated in a second mode.

2. The reconfigurable driver of claim 1, wherein the second pullup structure provides one-shot equalization to an output of the reconfigurable driver when the second pullup structure is operated in the first mode.

3. The reconfigurable driver of claim 1, wherein the control circuit is further configured to:
    generate the control signal by propagating a version of the data signal to the gate of the second transistor when the second pullup structure is operated in a third mode.

4. The reconfigurable driver of claim 3, wherein the data signal has a higher frequency when the second pullup structure is operated in the first mode than when the second pullup structure is operated in the third mode.

5. The reconfigurable driver of claim 4, wherein the data signal has a frequency of at least 4.8 gigahertz when the second pullup structure is operated in the first mode.

6. The reconfigurable driver of claim 1, wherein the second transistor comprises a thin-oxide P-type metal-oxide-semiconductor (PMOS) transistor.

7. The reconfigurable driver of claim 1, wherein the first transistor comprises a thin-oxide N-type metal-oxide-semiconductor (NMOS) transistor.

8. The reconfigurable driver of claim 1, wherein the control signal is configured to cause the first transistor to pull an output of the reconfigurable driver toward a high voltage level while the data signal is at a first signaling state, wherein the control signal is configured to cause the second transistor to pull the output of the reconfigurable driver toward the high voltage level commencing at a transition of the data signal from a second signaling state to the first signaling state, and wherein the control signal is configured to turn off the second transistor before the data signal returns to the second signaling state.

9. The reconfigurable driver of claim 1, wherein the second transistor is turned off after a delay following a transition of the data signal from a first signaling state to a second signaling state when the second pullup structure is operated in the first mode, and wherein the delay is determined by timing of the control signal generated by the control circuit when the second pullup structure is operated in the first mode.

10. The reconfigurable driver of claim 1, wherein the first pullup structure and the second pullup structure are provided in one of a plurality of reconfigurable drivers coupled to an output terminal of a transmitting device in a low-power double data rate synchronous dynamic random access memory.

11. An apparatus comprising:
    means for propagating a data signal from an input of a driver in an input/output circuit to a gate of a first transistor in a first pullup structure of the driver; and
    means for generating a control signal that is provided to a gate of a second transistor in a second pullup structure of the driver,
    wherein the means for generating the control signal is configured to generate the control signal by inverting and delaying the data signal when the second pullup structure is operated in a first mode, and
    wherein the control signal is configured to turn off the second transistor when the second pullup structure is operated in a second mode.

12. The apparatus of claim 11, wherein the second pullup structure provides one-shot equalization to an output of the driver when the second pullup structure is operated in the first mode.

13. The apparatus of claim 11, wherein the means for generating the control signal is configured to propagate a version of the data signal to the gate of the second transistor when the second pullup structure is operated in a third mode.

14. The apparatus of claim 13, wherein the data signal has a higher frequency when the second pullup structure is operated in the first mode than when the second pullup structure is operated in the third mode.

15. The apparatus of claim 14, wherein the data signal has a frequency of at least 4.8 gigahertz when the second pullup structure is operated in the first mode.

16. The apparatus of claim 11, wherein the second transistor comprises a thin-oxide P-type metal-oxide-semiconductor (PMOS) transistor.

17. The apparatus of claim 11, wherein the first transistor comprises a thin-oxide N-type metal-oxide-semiconductor (NMOS) transistor.

18. The apparatus of claim 11, wherein the control signal is configured to cause the first transistor to pull an output of the driver toward a high voltage level while the data signal is at a first signaling state, wherein the control signal is configured to cause the second transistor to pull the output of the driver toward the high voltage level commencing at a transition of the data signal from a second signaling state to the first signaling state, and wherein the control signal is configured to turn off the second transistor before the data signal returns to the second signaling state.

19. The apparatus of claim 11, wherein the means for generating the control signal is configured to:
configure the control signal to turn off the second transistor after a delay following a transition of the data signal from a first signaling state to a second signaling state when the second pullup structure is operated in the first mode,
wherein the delay is used by the means for generating the control signal to delay the data signal when generating the control signal.

20. The apparatus of claim 11, wherein the first pullup structure and the second pullup structure are provided in one of a plurality of reconfigurable drivers coupled to an output terminal of a transmitting device in a low-power double data rate synchronous dynamic random access memory.

21. A method for reconfiguring a driver in an input/output circuit, comprising:
causing a data signal to be propagated from an input of the driver to a gate of a first transistor in a first pullup structure of the driver;
providing a control signal to a gate of a second transistor in a second pullup structure of the driver;
generating the control signal by inverting and delaying the data signal when the second pullup structure is operated in a first mode; and
configuring the control signal to turn off the second transistor when the second pullup structure is operated in a second mode.

22. The method of claim 21, wherein the second pullup structure provides one-shot equalization to an output of the driver when the second pullup structure is operated in the first mode.

23. The method of claim 21, further comprising:
generating the control signal by propagating a version of the data signal to the gate of the second transistor when the second pullup structure is operated in a third mode.

24. The method of claim 23, wherein the data signal has a higher frequency when the second pullup structure is operated in the first mode than when the second pullup structure is operated in the third mode.

25. The method of claim 24, wherein the data signal has a frequency of at least 4.8 gigahertz when the second pullup structure is operated in the first mode.

26. The method of claim 21, wherein the second transistor comprises a thin-oxide P-type metal-oxide-semiconductor (PMOS) transistor.

27. The method of claim 21, wherein the first transistor comprises a thin-oxide N-type metal-oxide-semiconductor (NMOS) transistor.

28. The method of claim 21, wherein the control signal is configured to cause the first transistor to pull an output of the driver toward a high voltage level while the data signal is at a first signaling state, wherein the control signal is configured to cause the second transistor to pull the output of the driver toward the high voltage level commencing at a transition of the data signal from a second signaling state to the first signaling state, and wherein the control signal is configured to turn off the second transistor before the data signal returns to the second signaling state.

29. The method of claim 21, further comprising:
configuring the control signal to turn off the second transistor after a delay following a transition of the data signal from a first signaling state to a second signaling state when the second pullup structure is operated in the first mode,
wherein the delay is used to delay the data signal when generating the control signal when the second pullup structure is operated in the first mode.

30. The method of claim 21, wherein the first pullup structure and the second pullup structure are provided in one of a plurality of reconfigurable drivers coupled to an output terminal of a transmitting device in a low-power double data rate synchronous dynamic random access memory.

* * * * *